United States Patent
Shimada et al.

(10) Patent No.: US 6,737,169 B2
(45) Date of Patent: May 18, 2004

(54) POLYMER COMPOSITION, CURED PRODUCT, LAMINATE AND METHOD FOR PRODUCING THE CURED PRODUCT

(75) Inventors: Mibuko Shimada, Tokyo (JP); Nakaatsu Yoshimura, Tokyo (JP); Yuichi Hashiguchi, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/058,423

(22) Filed: Jan. 30, 2002

(65) Prior Publication Data

US 2002/0146573 A1 Oct. 10, 2002

(30) Foreign Application Priority Data

Jan. 31, 2001 (JP) .......................................... 2001-24780

(51) Int. Cl.⁷ ................................. B32B 9/04
(52) U.S. Cl. ....................... 428/447; 428/145; 428/147; 428/220; 522/31; 522/59; 522/71; 522/148; 522/172; 525/477; 528/38
(58) Field of Search .................. 428/477, 145, 428/147, 220; 522/31, 71, 59, 148, 172; 525/477; 528/38

(56) References Cited

U.S. PATENT DOCUMENTS

| 6,051,665 | A | * | 4/2000 | Yamada et al. |
| 6,207,728 | B1 | * | 3/2001 | Sekiguchi et al. |
| 6,214,416 | B1 | | 4/2001 | Sakagami et al. |
| 6,335,061 | B1 | | 1/2002 | Kanamori et al. |
| 6,440,569 | B1 | | 8/2002 | Kanamori et al. |
| 6,485,838 | B1 | | 11/2002 | Shimada et al. |

OTHER PUBLICATIONS

Machine Translation of JP 2000–191977.*

Patent Abstracts of Japan; Shimada et al., Publication No. 2000–191977; dated Jul. 11, 2000 (English Abstract).

* cited by examiner

Primary Examiner—Robert Dawson
Assistant Examiner—Christopher Keehan
(74) Attorney, Agent, or Firm—Oblon, Spivak, McClelland, Maier & Neustadt, P.C.

(57) ABSTRACT

A polymer composition containing a specific silyl group-containing polymer, in which the maximum size of particles contained therein is 2 $\mu$m or less, and the number of particles having a size of 0.2 $\mu$m to 2 $\mu$m is 1,000 particles/ml or less. The composition may further contain a specific compound or at least one component selected from an organosilane represented by $(R^1)_n Si(X)_{4-n}$, a hydrolyzate of the organosilane and a condensate of the organosilane. The composition is excellent in storage stability, high in hardness and excellent in mechanical strength such as wear resistance, so that a coating film having good taking-up properties even when no lubricant is contained, extremely smooth and having no difference in film thickness can be formed.

13 Claims, No Drawings

POLYMER COMPOSITION, CURED PRODUCT, LAMINATE AND METHOD FOR PRODUCING THE CURED PRODUCT

FIELD OF THE INVENTION

The present invention relates to a polymer composition which can form a smooth film, a cured product and a laminate thereof, and a method for producing the cured product. More particularly, the present invention relates to a silicon polymer composition.

BACKGROUND OF THE INVENTION

With recent miniaturization and lightening of optical and electronic parts, an extreme decrease in the thickness of coating films has progressed in the coating field. Recent improvement in thin film coating techniques, improvement in smoothness in forming substrates, and improvement in accuracy of techniques for inspecting surface unevenness have increased requirements for thin films.

Although techniques for forming thin films by methods such as spin coating, sputtering, vapor deposition and plating have hitherto been generally applied, these techniques are unsuitable for coating on films. There are some methods for coating films by roll coating. However, particles of lubricants are added to films and coating materials to retain hardness and scratch resistance, which causes poor surface smoothness due to unevenness caused by the lubricants. Further, defects caused by coating unevenness and cissing are liable to develop according to a decrease in the thickness of coating films, resulting in a tendency to deteriorate the smoothness. For improving the smoothness, it is preferred that the coating materials have a viscosity of higher than 10 mPa·s and a high concentration to increase the thickness of the films. Accordingly, there has been the problem that this is incompatible with a decrease in the thickness of the films.

As conventional release films for the production of ceramic condensers, there have been used films in which compositions containing fine particles of lubricants such as silica are applied onto substrate films and cured to form coating films. The above-mentioned lubricants are used for lowering the coefficient of friction of the release films in taking up them to make it difficult to be scratched. However, when a recent increase in the number of layers of the ceramic condensers results in the decreased thickness of the respective layers, the unevenness on surfaces of the coating films due to the fine particles of the lubricants gives a limitation on the smoothness of the surfaces of the layers of the ceramic condensers produced.

SUMMARY OF THE INVENTION

It is therefore an object of the present invention to provide a polymer composition which can form a coating film having high hardness, excellent in mechanical strength such as wear resistance, having good taking-up properties and difficult to be scratched even when no lubricants are contained, extremely smooth and having no difference in film thickness.

Further, another object of the present invention is to provide a polymer composition excellent in storage stability without increasing foreign matter in long-term storage.

Still another object of the present invention is to provide a cured product obtained from the above-mentioned polymer composition, and a method for producing the cured product.

According to the present invention, there is provided a polymer composition comprising (A) a polymer having a silicon atom bound to a hydrolytic group and/or a hydroxyl group, in which the maximum size of particles contained therein is 2 μm or less, and the number of particles having a size of 0.2 μm to 2 μm is 1,000 particles/ml or less.

The above-mentioned polymer composition may further contain (B) at least one component selected from the group consisting of an organosilane represented by the following general formula (1), a hydrolyzate of the organosilane and a condensate of the organosilane:

wherein, $R^1$, which may be the same or different when two or more $R^1$ groups are present, represents a monovalent organic group having 1 to 8 carbon atoms; X represents a halogen atom or an alkoxyl or acetoxyl group having 1 to 8 carbon atoms; and n is an integer of 0 to 2.

The above-mentioned polymer composition may further contain a compound having a recurring unit represented by the following general formula (2):

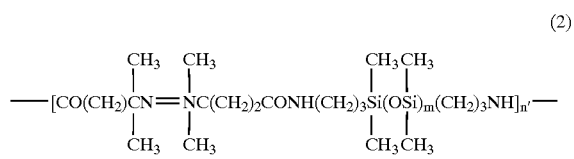

wherein m is from 5 to 250, and n' is from 4 to 40.

The polystyrene-converted weight-average molecular weight of the above-mentioned component (A) is preferably from 1,000 to 100,000.

The above-mentioned polymer composition may further contain (C) a photoacid generating agent.

The above-mentioned polymer composition may further contain (D) a dehydrating agent.

Further, according to the present invention, there is provided a cured product obtained by coating a substrate with the above-mentioned polymer composition and subjecting the composition to heat curing and/or photo-curing.

A surface of the above-mentioned substrate may have an arithmetical mean roughness of 0.5 μm or less and/or a maximum height of projections thereon of 2 μm or less.

The above-mentioned substrate may be a film whose surface has an arithmetical mean roughness of 0.5 μm or less and/or a maximum height of projections thereon of 2 μm or less.

A surface of the above-mentioned cured product may have an arithmetical mean roughness of 0.2 μm or less and/or a maximum height of projections thereon of 2 μm or less.

The surface of the above-mentioned cured product may have a hydroxyl group concentration of 10% or less. The surface of the above-mentioned cured product may have a coefficient of dynamic friction of 0.5 or less.

The above-mentioned cured product may have a release, non-adhesive function, and is useful for a release film for the production of a ceramic condenser.

Still further, according to the present invention, there is provided a laminate having the cured product composed of the above-mentioned polymer composition on a substrate film, in which a surface of the substrate has an arithmetical mean roughness of 0.5 μm or less and/or a maximum height of projections thereon of 2 μm or less and 1,000 projections/ m² or less of projections having a height of 0.2 μm to 2 μm, and a surface of the cured product has an arithmetical mean roughness of 0.2 μm or less and/or a maximum height of projections thereon of 2 μm or less and 500 projections/m² or less of projections having a height of 0.2 μm to 2 μm. This laminate is useful for a release film for the production of a ceramic condenser.

Yet still further, according to the present invention, there is provided a method for producing a cured product, which comprises coating a substrate with the above-mentioned polymer composition, and subjecting the composition to heat-curing and/or photo-curing.

DESCRIPTION OF THE PREFERRED EMBODIMENTS

Respective components constituting the polymer composition of the present invention will be described in turn below.

Component (A)

Component (A) is a polymer in which a silyl group having a silicon atom is bonded to a hydrolytic group and/or a hydroxyl group (hereinafter referred to as a "specific silyl group"), preferably at an end and/or a side chain of a molecular chain of the polymer.

In the polymer composition of the present invention, silyl group-containing polymer (A) is a component that brings about excellent coating film performances by co-condensation of the hydrolytic group and/or the hydroxyl group of the silyl group with itself and with component (B) in curing the coating film.

The content of silicon atoms in component (A) is generally from 0.001% to 20% by weight, and preferably from 0.01% to 15% by weight, based on the whole component (A).

The preferred specific silyl group is a group expressed by the following general formula (3):

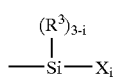

(3)

wherein, X represents a hydrolytic group such as a halogen atom, an alkoxyl group, an acetoxyl group, a phenoxy group, a thioalkoxyl group or an amino group, or a hydroxyl group; $R^3$ represents a hydrogen atom, an alkyl group having 1 to 10 carbon atoms or an aralkyl group having 1 to 10 carbon atoms; and i is an integer of 1 to 3.

Component (A) can be produced, for example, by methods described in the following (a) and (b):

(a) A method of allowing a hydrosilane compound corresponding to the above-mentioned general formula (3) (hereinafter referred to as "hydrosilane compound (a)") to react with a carbon-carbon double bond in a carbon-carbon double bond-containing vinyl polymer (hereinafter referred to as an "unsaturated vinyl polymer") by addition reaction; and (b) A method of copolymerizing a silane compound represented by the following general formula (4) (hereinafter referred to as "unsaturated silane compound (b)") with another vinyl monomer:

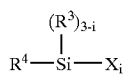

(4)

wherein, X, $R^3$ and i each have the same meanings as given for X, $R^3$ and i in general formula (3); and $R^4$ represents an organic group having a polymerizable double bond.

Hydrosilane compounds (a) used in the method of (a) described above include, for example, halogenated silanes such as methyldichlorosilane, trichlorosilane and phenyldichlorosilane; alkoxysilanes such as methyldimethoxysilane, methyldiethoxysilane, phenyldimethoxysilane, trimethoxysilane and triethoxysilane; acyloxysilanes such as methyldiacetoxysilane, phenyldiacetoxy-silane and triacetoxysilane; and aminoxysilanes such as methyldiaminoxysilane, triaminoxysilane and dimethylaminoxysilane.

These hydrosilane compounds (a) can be used either alone or as a mixture of two or more of them.

There is no particular limitation on the unsaturated vinyl polymers used in the method of (a) described above, as long as they are polymers other than hydroxyl group-containing polymers. The unsaturated vinyl polymers can be produced by a method of (a-1) or (a-2) described below or a combination thereof.

(a-1) A method of (co)polymerizing a vinyl monomer having a functional group (hereinafter referred to as "functional group (α)"), and then, reacting an unsaturated compound having a functional group which can react with functional group (α) (hereinafter referred to as "functional group (β)") and a carbon-carbon double bond with functional group (α) in the (co)polymer, thereby producing the unsaturated vinyl polymer having carbon-carbon double bonds at side chains of a molecular chain of the polymer.

(a-2) A method of (co)polymerizing a vinyl monomer, using a radical polymerization initiator having functional group (α) (for example, 4,4-azobis-4-cyanovaleric acid), or using a radical polymerization initiator and a chain transfer agent both having functional group (α) (for example, 4,4-azobis-4-cyanovaleric acid and dithioglycolic acid), to synthesize a (co)polymer having functional group (α) derived from the radical polymerization initiator or the chain transfer agent at one end or both ends of a molecular chain of the polymer, and then, reacting an unsaturated compound having functional group (β) and a carbon-carbon double bond with functional group (α) in the (co)polymer, thereby producing the unsaturated vinyl polymer having the carbon-carbon double bond(s) at one end or both ends of the molecular chain of the polymer.

Examples of the reactions of functional group (α) with functional group (β) in the methods of (a-1) and (a-2) include the esterification reaction of a carboxyl group with a hydroxyl group, the ring-opening esterification reaction of a carboxylic anhydride group with a hydroxyl group, the ring-opening esterification reaction of a carboxyl group with an epoxy group, the amidation reaction of a carboxyl group with an amino group, the ring-opening amidation reaction of a carboxylic anhydride group with an amino group, the ring-opening addition reaction of an epoxy group with an amino group, the urethanation reaction of a hydroxyl group with an isocyanate group, and a combination of these reactions. As a polymerization initiator, a molecular weight modifier, a chelating agent and an inorganic electrolyte, there can be used known ones.

The vinyl monomers having functional group (α) include, for example, unsaturated carboxylic acids such as (meth)acrylic acid, crotonic acid, maleic acid, fumaric acid and itaconic acid; unsaturated carboxylic anhydrides such as maleic anhydride and itaconic anhydride; hydroxyl group-containing vinyl monomers such as 2-hydroxyethyl (meth)acrylate, 2-hydroxypropyl (meth)acrylate, 3-hydroxypropyl (meth)acrylate, N-methylol(meth)acrylamide and 2-hydroxyethyl vinyl ether; amino group-containing vinyl monomers such as 2-aminoethyl (meth)acrylate, 2-aminopropyl (meth)acrylate 3-aminopropyl (meth) acrylate and 2-aminoethyl vinyl ether; amineimido group-containing vinyl monomers such as 1,1,1-trimethylamine (meth)acrylimide, 1-methyl-1-ethylamine(meth)-acrylimide, 1,1-dimethyl-l-(2-hydroxypropyl)amine(meth) acrylimide, 1,1-dimethyl-1-(2'-phenyl-2'-hydroxyethyl) amine(meth)acrylimide and 1,1-dimethyl-l-(2'-hydroxy-2'-phenoxypropyl)amine (meth)acrylimide; and epoxy group-containing vinyl monomers such as glycidyl (meth)acrylate and allyl glycidyl ether.

These functional group (α)-containing vinyl monomers can be used either alone or as a mixture of two or more of them. The other vinyl monomers copolymerizable with -the functional group (α)-containing vinyl monomers include, for example, (1) aromatic vinyl monomers such as styrene, α—methylstyrene, 4-methylstyrene, 2-methylstyrene, 3-methylstyrene, 4-methoxystyrene, 2-hydroxymethylstyrene, 4-ethylstyrene, 4-ethoxystyrene, 3,4-dimethylstyrene, 3,4-diethylstyrene, 2-chlorostyrene, 3-chlorostyrene, 4-chloro-3-methylstyrene, 4-t-butylstyrene, 2,4-dichlorostyrene, 2,6-dichlorostyrene and 1-vinylnaphthalene;

(2) (meth)acrylate compounds such as methyl (meth) acrylate, ethyl (meth)acrylate, propyl (meth)acrylate, n-butyl (meth)acrylate, i-butyl (meth)acrylate, amyl (meth)acrylate, i-amyl (meth)acrylate, hexyl (meth) acrylate, 2-ethylhexyl (meth)acrylate, n-octyl (meth) acrylate and cyclohexyl (meth)-acrylate;

(3) multi-functional monomers such as divinylbenzene, ethylene glycol di(meth)acrylate, diethylene glycol di(meth)-acrylate, triethylene glycol di(meth)acrylate, tetraethylene glycol di(meth)acrylate, propylene glycol di(meth)acrylate, dipropylene glycol di(meth)acrylate, tripropylene glycol di(meth)acrylate, tetrapropylene glycol di(meth)acrylate, butanediol di(meth)acrylate, hexanediol di(meth)acrylate, trimethylolpropane tri(meth)acrylate and pentaerythritol tetra(meth)acrylate;

(4) acid amide compounds such as (meth)acrylamide, N-methylol (meth)acrylamide, N-methoxymethyl (meth)acrylamide, N-butoxymethyl(meth)acrylamide, N,N'-methylenebisacrylamide, diacetoneacrylamide, maleamide and maleimide;

(5) vinyl compounds such as vinyl chloride, vinylidene chloride and fatty acid vinyl esters;

(6) aliphatic conjugated dienes such as 1,3-butadiene, 2-methyl-1,3-butadiene, 2,3-dimethyl-1,3-butadiene, 2-neo-pentyl-1,3-butadiene, 2-chloro-1,3-butadiene, 2-cyano-1,3-butadiene, isoprene, straight-chain substituted conjugated pentadiene substituted by a substituent group such as an alkyl group, a halogen atom, a cyano group or the like and straight-chain or side-chain conjugated hexadinene;

(7) fluoroolefines such as tetrafluoroethylene, hexafluoropropylene, fluorovinylidene, chlorotrifluoroethylene and 3,3,3-trifluoropropylene;

(8) (fluoroalkyl) vinyl ethers or (fluoroalkoxyalkyl) vinyl ethers represented by $CH_2=CH-O-Rf$ (wherein Rf represents a fluorine atom-containing alkyl or alkoxyalkyl group);

(9) perfluoro(alkyl vinyl ethers) such as perfluoro(methyl vinyl ether), perfluoro(ethyl vinyl ether), perfluoro (propyl vinyl ether), perfluoro(butyl vinyl ether) and perfluoro(i-butyl vinyl ether);

(10) perfluoro(alkoxyalkyl vinyl ethers) such as perfluoro (propoxypropyl vinyl ether);

(11) vinyl cyanide compounds such as acrylonitrile and methacrylonitrile;

(12) fluorine-containing (meth)acrylates such as 2,2,2-trifluoroethyl (meth)acrylate, 2,2,3,3,3-pentafluoropropyl (meth)acrylate, 2-(perfluorobutyl) ethyl (meth)acrylate, 2-(perfluorohexyl)ethyl (meth) acrylate, 2-(perfluorooctyl)ethyl (meth)acrylate, 2-(perfluorodecyl)ethyl (meth)acrylate, 1H,1H,5H-octafluoropentyl (meth)acrylate and 1H,1H,2H,2H-heptadecafluorodecyl (meth)acrylate;

(13) piperidine monomers such as 4-(meth)acryloyloxy-2,2,6,6,-tetramethylpiperidine, 4-(meth)acryloylamino-2,2,6,6-tetramethylpiperidine and 4-(meth) acryloyloxy-1,2,2,6,6-penta-methylpiperidine;

(14) vinyl ethers such as vinyl glycidyl ether, 2-hydroxyethyl vinyl ether, 3-hydroxypropyl vinyl ether, 2-hydroxypropyl vinyl ether, 4-hydroxybutyl vinyl ether, 3-hydroxybutyl vinyl ether, 5-hydroxypentyl vinyl ether and 6-hydroxyhexyl vinyl ether;

(15) allyl ethers such as allyl glycidyl ether, 2-hydroxyethyl allyl ether, 4-hydroxybutyl allyl ether and glycerol monoallyl ether; and

(16) alkyl vinyl ethers or cycloalkyl vinyl ethers such as methyl vinyl ether, ethyl vinyl ether, n-propyl vinyl ether, i-propyl vinyl ether, n-butyl vinyl ether, i-butyl vinyl ether, tert-butyl vinyl ether, n-pentyl vinyl ether, n-hexyl vinyl ether, n-octyl vinyl ether, n-dodecyl vinyl ether, 2-ethylhexyl vinyl ether and cyclohexyl vinyl ether.

The unsaturated compounds having functional group (β) and carbon-carbon double bonds include, for example, vinyl monomers similar to the functional group (α)-containing vinyl monomers, isocyanate group-containing unsaturated compounds obtained by the equimolar reaction of the above-mentioned hydroxyl group-containing vinyl monomers with diisocyanate compounds.

Specific examples of unsaturated silane compound (b) used in the method of (b) described above include $CH_2=CHSi(CH_3)(OCH_3)_2$, $CH_2=CHSi(OCH_3)_3$, $CH_2=CHSi(OC_2H_5)_3$, $CH_2=CHSi(CH_3)Cl_2$, $CH_2=CHSiCl_3$, $CH_2=CHCOO(CH_2)_2Si(CH_3)(OCH_3)_2$, $CH_2=CHCOO(CH_2)_2Si(OCH_3)_3$, $CH_2=CHCOO(CH_2)_3Si(CH_3)(OCH_3)_2$, $CH_2=CHCOO(CH_2)_3Si(OCH_3)_3$, $CH_2=CHCOO(CH_2)_2Si(CH_3)Cl_2$, $CH_2=CHCOO(CH_2)_2SiCl_3$, $CH_2=CHCOO(CH_2)_3Si(CH_3)Cl_2$, $CH_2=CHCOO(CH_2)_3SiCl_3$, $CH_2=C(CH_3)COO(CH_2)_2Si(CH_3)(OCH_3)_2$, $CH_2=C(CH_3)COO(CH_2)_2Si(OCH_3)_3$, $CH_2=C(CH_3)COO(CH_2)_3Si(CH_3)(OCH_3)_2$, $CH_2=C(CH_3)COO(CH_2)_3Si(OCH_3)_3$, $CH_2=C(CH_3)COO(CH_2)_2Si(CH_3)Cl_2$, $CH_2=C(CH_3)COO(CH_2)_2SiCl_3$, $CH_2=C(CH_3)COO(CH_2)_3Si(CH_3)Cl_2$, $CH_2=C(CH_3)COO(CH_2)_3SiCl_3$,

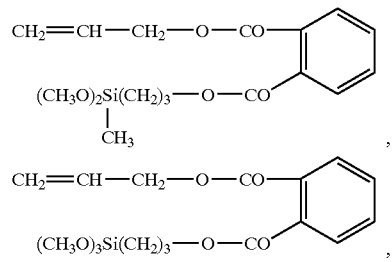

-continued

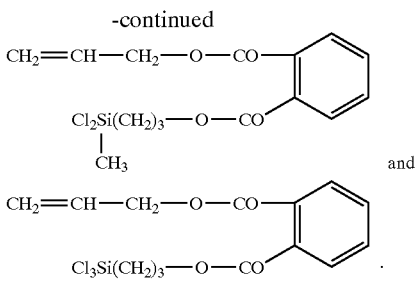

and

These can be used either alone or as a combination of two or more of them.

Further, other examples of component (A) include specific silyl group-containing epoxy resins and specific silyl group-containing polyester resins.

The above-mentioned specific silyl group-containing epoxy resins can be produced, for example, by allowing epoxy groups in epoxy resins such as bisphenol A type epoxy resins, bisphenol F type epoxy resins, hydrogenated bisphenol A type epoxy resins, aliphatic polyglycidyl ethers and aliphatic polyglycidyl esters to react with aminosilanes, vinylsilanes, carboxysilanes and glycidylsilanes having the specific silyl groups.

Further, the above-mentioned specific silyl group—containing polyester resins can be produced, for example, by allowing carboxyl groups or hydroxyl groups contained in polyester resins to react with aminosilanes, carboxysilanes or glycidylsilanes having the specific silyl groups.

The polystyrene-converted number-average molecular weight (hereinafter referred to as "Mn") of component (A) is preferably from 1,000 to 100,000, and more preferably from 3,000 to 50,000.

In the present invention, components (A) can be used either alone or as a mixture of two or more of them obtained as described above.

Component (B)

Component (B) indicates at least one selected from an organosilane represented by the above-mentioned general formula (1) (hereinafter referred to as "organosilane (1)"), a hydrolyzate of organosilane (1) and a condensate of organosilane (1). That is to say, component (B) may be one of these three kinds, a mixture of any two kinds or a mixture of all the three kinds.

The above-mentioned condensate of organosilane (1) is one in which silanol groups in the hydrolyzate of organosilane (1) have been condensed to form an Si—O—Si bond. In the invention, however, it is not necessary that the silanol groups have all been condensed, and the concept of the condensate includes one in which only a few of the silanol groups have been condensed and a mixture of condensates whose levels of condensation are different.

In general formula (1), the monovalent organic groups of $R^1$ each having 1 to 8 carbon atoms include, for example, an alkyl group such as methyl, ethyl, n-propyl, i-propyl, n-butyl, i-butyl, sec-butyl, t-butyl, n-hexyl, n-heptyl, n-octyl or 2-ethylhexyl, a vinyl group, an allyl group, a cyclohexyl group, a phenyl group, an acyl group, a glycidyl group, a (meth)acryloxy group, a ureido group, an amido group, a fluoroacetoamido group, an isocyanate group and substituted derivatives thereof.

The substituent groups in the substituted derivatives of $R^1$ include, for example, a halogen atom, an unsubstituted or substituted amino group, a hydroxyl group, a mercapto group, an isocyanate group, a glycidoxy group, a 3,4-epoxycyclohexyl group, a (meth)acryloxy group, a ureido group and an ammonium base. The number of carbon atoms in the substituted derivative of $R^1$ is 8 or less, including the carbon atoms of the substituent group.

When two $R^1$ groups are present in general formula (1), they may be the same or different.

In the above-mentioned general formula (1), X is a hydrolytic group, which is a halogen atom, or an alkoxyl or acetoxyl group having 1 to 8 carbon atoms. The halogen atoms include fluorine, chlorine, bromine and iodine. The above-mentioned alkoxyl or acetoxyl groups include a methoxy group, an ethoxy group, a propoxy group, a butoxy group, an acetoxyethoxy group, a 2-(meth)acryloxyethoxy group, a 3-(meth)acryloxypropoxy group, a 4-(meth)acryloxybutoxy group, an epoxy group-containing alkoxyl group such as a glycidyloxy group or an epoxidated cyclohexylethoxy group, an oxetane group-containing alkoxyl group such as a methyloxetanemethoxy group or an ethyloxetanemethoxy group, and a 6-membered ring ether group-containing alkoxyl group such as an oxacyclohexyloxy group. Of the above-mentioned alkoxyl or acetoxyl groups each having 1 to 8 carbon atoms, preferred are the methoxy group and the ethoxy group. These alkoxyl groups can be easily hydrolyzed to form silanol groups.

In general formula (1), n is an integer of 0 to 2.

The plural X groups present in the above-mentioned general formula (1) may be the same or different.

Specific examples of such organosilanes (1) include methyltriacetyloxysilane and dimethyldiacetyloxysilane, as well as tetraalkoxysilanes such as tetramethoxysilane, tetraethoxysilane, tetra-n-propoxysilane, tetra-i-propoxysilane and tetra-n-butoxysilane; trialkoxysilanes such as methyltrimethoxysilane, methyltriethoxysilane, ethyltrimethoxysilane, ethyltriethoxy-silane, n-propyltrimethoxysilane, n-propyltriethoxysilane, i-propyltrimethoxysilane, i-propyltriethoxysilane, n-butyltrimethoxysilane, n-butyltriethoxysilane, n-pentyltrimethoxysilane, n-hexyltrimethoxysilane, n-heptyltrimethoxysilane, n-octyltrimethoxysilane, vinyltrimethoxysilane, vinyltriethoxysilane, cyclohexyltrimethoxysilane, cyclohexyltriethoxysilane, phenyltrimethoxysilane, phenyltriethoxysilane, 3-chloropropyltrimethoxysilane, 3-chloropropyltriethoxysilane, 3,3,3-trifluoropropyltrimethoxysilane, 3,3,3-trifluoropropyltriethoxysilane, 3-aminopropyltrimethoxysilane, 3-aminopropyltriethoxysilane, 2-hydroxyethyltrimethoxysilane, 2-hydroxyethyltriethoxysilane, 2-hydroxypropyltrimethoxysilane, 2-hydroxypropyltriethoxysilane, 3-hydroxypropyltrimethoxysilane, 3-hydroxypropyltriethoxysilane, 3-mercaptopropyltrimethoxysilane, 3-mercaptopropyltriethoxysilane, 3-isocyanatopropyltrimethoxysilane, 3-isocyanatopropyltriethoxysilane, 3-glycidoxypropyltrimethoxysilane, 3-glycidoxypropyltriethoxysilane, 2-(3,4-epoxycyclohexyl)ethyl-trimethoxysilane, 2-(3,4-epoxycyclohexyl)ethyltriethoxysilane, 3-(meth)acryloxypropyltrimethoxysilane, 3-(meth)acryloxypropyltriethoxysilane, 3-ureidopropyltrimethoxysilane and 3-ureidopropyltriethoxysilane; and dialkoxysilanes such as dimethyldimethoxysilane, dimethyldiethoxysilane, diethyldimethoxysilane, diethyldiethoxysilane, di-n-propyldimethoxysilane, di-n-propyldiethoxysilane, di-i-propyldimethoxysilane, di-i-propyldiethoxysilane, di-n-butyldimethoxysilane, di-n-butyldiethoxysilane, di-n-pentyldimethoxysilane, di-n-pentyldiethoxysilane, di-n-hexyldimethoxysilane, di-n-hexyldiethoxysilane, di-n-heptyldimethoxysilane, di-n-heptyldiethoxysilane, di-n-octyldimethoxysilane, di-n- octyldiethoxysilane, di-n-cyclo-hexyldimethoxysilane, di-n-cyclohexyldiethoxysilane, diphenyl-dimethoxysilane and diphenyldiethoxysilane.

The hydrolyzate or condensate of organosilane (1) means a composition containing at least one constituent unit selected from (a) $R_3SiO_{2/1}$, (b) $R_2SiO_{2/2}$, (c) $RSiO_{3/2}$ and (d) $SiO_{4/2}$. Commercially available products thereof include MKC Silicate manufactured by Mitsubishi Chemical Corporation, ethyl silicate manufactured by Colcoat Co., silicon resins manufactured by Dow Corning Toray Silicone Co., Ltd., silicon resins manufactured by Toshiba Silicone Co., for example, YR 3370 and TSR 127B, silicon resins manufactured by Shin-Etsu Chemical Co., Ltd., for example, X40-9220 and X40-9225, polydimethylsiloxane, for example, X62-2676, KS-837, KS-779, KS-3656, KS-778, KS-835, KS-3650, KS-3604, KS-847, KS-847T, KS-770L, KS-776A, KS-3600, KS-856, KS-3702L, KS-3603, X-62-2405, KS-3504, KS-3703, KS-830, KS-839L, KS-3503, KS-3601, KS-830E and KS-3502, and silicon oligomers manufactured by Nippon Unicar Company Limited, for example, MAC 2101 and MAC 2301. They may be used as such or as condensates.

Of these, the trialkoxysilanes and the dialkoxysilanes are preferred. The trialkoxysilanes are preferably methyltrimethoxysilane, methyltriethoxysilane and glycydoxypropyltrimethoxysilane, and the dialkoxysilanes are preferably dimethyldimethoxysilane and dimethyldiethoxysilane.

In the present invention, only the trialkoxysilane, or a combination of 40 to 95 mol % of the trialkoxysilane and 60 to 5 mol % of the dialkoxysilane is particularly preferred as organosilane (1). In the case of the trialkoxysilane, a combination of methyltrimethoxysilane and glycydoxypropyltrimethoxysilane is preferred. The resulting coating film can be softened to improve Adhesiveness.

Organosilane (1) is used as it is, or as the hydrolysate and/or the condensate. When organosilane (1) is employed as the hydrolysate and/or the condensate, it can also be previously hydrolyzed and/or condensed to use it as component (B). However, it is preferred that a proper amount of water is added in mixing organosilane (1) with the remainder components to prepare the composition as described later, thereby hydrolyzing and/or condensing organosilane (1) to yield component (B).

When component (B) is used as the condensate, the polystyrene-converted weight-average molecular weight (hereinafter referred to as "Mw") of the condensate is preferably from 300 to 100,000, more preferably from 400 to 70,000, and particularly preferably from 1,000 to 50,000. When the Mw is from 1,000 to 50,000, the polymer composition of the present invention is improved in curing properties.

In the present invention, components (B) can be used either alone or as a mixture of two or more of them.

The compound having a recurring unit represented by the above-mentioned general formula (2) which is used in the present invention is a polymerization initiator having plural polydimethylsiloxane-azo group bonds, and acts as a polymerization catalyst for the above-mentioned component (A). Specifically, commercially available products thereof include VPS-1001 and VPS-0501 (trade names) manufactured by Wako Pure Chemical Industries, Ltd.

The amount of the above-mentioned compound used is preferably from 0.01 part to 70 parts by weight, more preferably from 0.05 part to 60 parts by weight, and particularly preferably from 0.1 part to 50 parts by weight, based on 100 parts by weight of component (A) converted to a solid basis. Less than 0.01 part by weight results in the low degree of polymerization to fail to obtain a desired polymer, whereas exceeding 70 parts by weight results in the generation of layer separation, which also causes a failure to obtain a polymer having desired molecular weight.

Solvents

In the polymer composition of the present invention, the above-mentioned component (A) is indispensable, and components (B) to (D) are contained. Usually, water and/or an organic solvent is added as a solvent for conducting hydrolysis and/or condensation or dispersing a granular component in preparing the composition. The amount of water used in the present invention is usually from about 0.5 to about 3 moles, and preferably from about 0.7 to about 2 moles, per mole of organosilane (1) in component (B).

The above-mentioned organic solvent is used mainly for uniformly mixing components (A) and (B), and components (C) and (D), adjusting the total solid concentration of the composition, allowing the composition to be applicable to various coating methods, and further improving the dispersion stability and storage stability of the composition.

There is no particular limitation on such organic solvents, as long as they can uniformly mix the above-mentioned respective components. Examples thereof include, for example, alcohols, aromatic hydrocarbons, ethers, ketones, esters and so forth.

Of these organic solvents, specific examples of the alcohols include methanol, ethanol, n-propyl alcohol, i-propyl alcohol, n-butyl alcohol, sec-butyl alcohol, t-butyl alcohol, n-hexyl alcohol, n-octyl alcohol, ethylene glycol, diethylene glycol, triethylene glycol, ethylene glycol monobutyl ether and ethylene glycol monoethyl ether acetate.

Specific examples of the aromatic hydrocarbons include benzene, toluene and xylene, and specific examples of the ethers include tetrahydrofuran and dioxane. Specific examples of the ketones include acetone, methyl ethyl ketone, methyl isobutyl ketone and diisobutyl ketone, and specific examples of the esters include ethyl acetate, propyl acetate, butyl acetate and propylene carbonate.

These organic solvents can be used either alone or as a mixture of two or more of them.

The total solid concentration of the polymer composition of the present invention is preferably 50% by weight or less, and is appropriately adjusted depending on the purpose of application. For example, when the composition is used for the purpose of forming a thin film, the solid concentration is generally 20% by weight or less. When the composition is used for the purpose of forming a thick film, the solid concentration is generally from 20% to 50%, and preferably from 30% to 45% by weight. When the total solid concentration of the composition exceeds 50% by weight, the storage stability tends to be declined.

There is no particular limitation on the viscosity of the polymer composition of the present invention in coating. However, when the cured product has a film thickness of 2 μm or less, the viscosity of the composition is preferably 10 mPa·s or less, and more preferably 8 mPa·s or less.

Component (E)

The polymer composition of the present invention may contain a catalyst, component (E), for accelerating the hydrolysis and/or condensation reaction of component (A) and component (B).

The use of component (E) can accelerate the curing speed of the resulting coating film and enhance the crosslinking reaction of alkoxysilyl groups, thereby obtaining the coating film excellent in curing properties at low temperatures, in hardness, in strength such as sting resistance, and in long-term durability.

Such component (E) is preferably an acidic compound, a alkaline compound, a salt compound, an amine compound, an organometallic compound and/or a partial hydrolyzate thereof (the organometallic compound and/or the partial hydrolyzate thereof is hereinafter collectively referred to as "an organometallic compound, etc.").

The above-mentioned acidic compounds include, for example, acetic acid, hydrochloric acid, sulfuric acid, phosphoric acid, alkyltitanic acids, p-toluenesulphonic acid and phthalic acid, and preferred is acetic acid.

Further, the above-mentioned alkaline compounds include, for example, sodium hydroxide and potassium hydroxide, and preferred is sodium hydroxide.

Still further, the above-mentioned salt compounds include, for example, alkali metal salts of naphthenic acid, octylic acid, nitrous acid, sulfurous acid, aluminic acid and carbonic acid.

The above-mentioned amine compounds include, for example, various modified amines used as hardeners for epoxy resins, as well as ethylenediamine, hexamethylenediamine, diethylenetriamine, triethylenetetramine, tetraethylenepentamine, piperidine, piperadine, m-phenylenediamine, p-phenylenediamine, ethanolamine, triethylamine, 3-aminopropyl-trimethoxysilane, 3-aminopropyltriethoxysilane, 3-(2-aminoethyl)aminopropyltrimethoxysilane, 3-(2-aminoethyl)aminopropyltriethoxysilane, 3-(2-aminoethyl)aminopropylmethyldimethoxysilane, 3-anilinopropyl-trimethoxysilane, alkylamine salts and quaternary ammonium salts, and preferred are 3-aminopropyltriethoxysilane, 3-aminopropyltriethoxysilane and 3-(2-aminoethyl)aminopropyltriethoxysilane.

Further, the above-mentioned organometallic compounds, etc. include, for example, compounds expressed by the following general formula (5) (hereinafter referred to as "organometallic compounds (5)"), organometallic compounds of tetravalent tin each having one or two alkyl groups each having 1 to 10 carbon atoms, the two alkyl groups being bonded to the same tin atom (hereinafter referred to as "organic tin compounds"), and partial hydrolyzates of these compounds.

$$M(OR^5)_p(R^6COCHCOR^7)_q \quad (5)$$

wherein M represents zirconium, titanium or aluminum, $R^5$ and $R^6$, which may be the same or different, each represent a monovalent hydrocarbon group having 1 to 6 carbon atoms such as ethyl, n-propyl, i-propyl, n-butyl, sec-butyl, t-butyl, n-pentyl, n-hexyl, cyclohexyl or phenyl, $R^7$ represents an alkoxyl group having 1 to 16 carbon atoms such as methoxy, ethoxy, n-propoxy, i-propoxy, n-butoxy, sec-butoxy, t-butoxy, lauryloxy or stearyloxy, as well as a monovalent hydrocarbon group having 1 to 6 carbon atoms as is the case with $R^5$ and $R^6$, and p and q are integers ranging from 0 to 4, and (p+q)=(valence of M).

Specific examples of organometallic compounds (5) include:

(a) organic zirconium compounds such as tetra-n-butoxy-zirconium, ethylacetoacetate-zirconium-tri-n-butylate, bis-(ethylacetoacetate)-zirconium-di-n-butylate, tris (ethylacetoacetate)-zirconium-n-butylate, tetrakis(n-propylacetoacetate)-zirconium, tetrakis (acetylacetoacetate)-zirconium, and tetrakis (ethylacetoacetate)-zirconium;

(b) organic titanium compounds such as tetra-i-propoxytitanium, tetra-n-propoxytitanium, bis (ethylacetoacetate)-titanium-di-i-propylate, bis (acetylacetate)-titanium-di-i-propylate, bis (acetylacetate)-titanium-di-n-propylate, tetrakis(2-ethylhexyloxy)-titanium, tetrastearyloxytitanium, titanium-i-propoxyoctylene glycol, titanium stearate, a polymer of tetra-i-propoxytitanium and a polymer of tetra-n-propoxytitanium; and (c) organic aluminum compounds such as tri-i-propoxyaluminum, ethylacetoacetate-aluminum-di-i-propylate, acetylacetonatealuminum-di-i-propylate, bis (ethylacetoacetate)-aluminum-ipropylate, bis (acetylacetonate)-aluminum-i-propylate, tris (ethylacetoacetate)-aluminum, tris(acetylacetonate)-aluminum and bis(ethylacetoacetate)-aluminum-monoacetylacetonate.

Of these organometallic compounds (5) and the partial hydrolyzates thereof, preferred are ethylacetoacetate-zirconium-tri-n-butylate, bis(acetylacetonate)-titanium-di-i-propylate, ethylacetoacetate-aluminum-di-i-propylate, tris-(ethylacetoacetate)-aluminum and the partial hydolyzates of these compounds.

Specific examples of the organic tin compounds include: carboxylic acid type organic tin compounds such as
$(C_4H_9)_2Sn(OCOC_{11}H_{23})_2$,
$(C_4H_9)_2Sn(OCOCH=CHCOOCH_3)_2$,
$(C_4H_9)_2Sn(OCOCH=CHCOOC_4H_9)_2$,
$(C_8H_{17})_2Sn(OCOC_8H_{17})_2$,
$(C_8H_{17})_2Sn(OCOC_{11}H_{23})_2$,
$(C_8H_{17})_2Sn(OCOCH=CHCOOCH_3)_2$,
$(C_8H_{17})_2Sn(OCOCH=CHCOOC_4H_9)_2$,
$(C_8H_{17})_2Sn(OCOCH=CHCOOC_8H_{17})_2$,
$(C_8H_{17})_2Sn(OCOCH=CHCOOC_{16}H_{33})_2$,
$(C_8H_{17})_2Sn(OCOCH=CHCOOC_{17}H_{35})_2$,
$(C_8H_{17})_2Sn(OCOCH=CHCOOC_{18}H_{37})_2$,
$(C_8H_{17})_2Sn(OCOCH=CHCOOC_{20}H_{41})_2$,

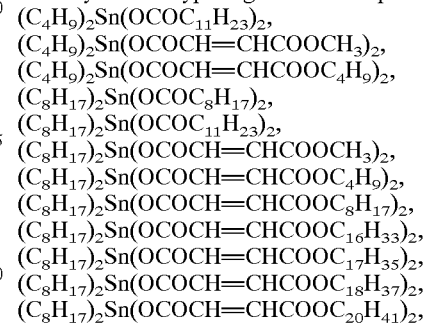

$(C_4H_9)Sn(OCOC_{11}H_{23})_3$, and
$(C_4H_9)Sn(OCONa)_3$;
mercaptide type organic tin compounds such as
$(C_4H_9)_2Sn(SCH_2COOC_8H_{17})_2$,
$(C_4H_9)_2Sn(SCH_2CH_2COOC_8H_{17})_2$,
$(C_8H_{17})_2Sn(SCH_2COOC_8H_{17})_2$,
$(C_8H_{17})_2Sn(SCH_2CH_2COOC_8H_{17})_2$,
$(C_8H_{17})_2Sn(SCH_2COOC_{12}H_{25})_2$,
$(C_8H_{17})_2Sn(SCH_2CH_2COOC_{12}H_{25})_2$,
$(C_4H_9)Sn(SCOCH=CHCOOC_8H_{17})_3$,
$(C_8H_{17})Sn(SCOCH=CHCOOC_8H_{17})_3$, and

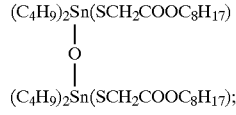

sulfide type organic tin compounds such as $(C_4H_9)_2Sn=S$, $(C_8H_{17})_2Sn=S$, and

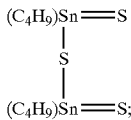

chloride type organic compounds such as $(C_4H_9)SnCl_3$, $(C_4H_9)_2SnCl_2$, $(C_8H_{17})_2SnCl_2$, and

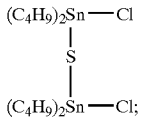

organic tin oxides such as $(C_4H_9)_2SnO$ and $(C_8H_{17})_2SnO$; and
reaction products of these organic tin oxides and ester compounds such as ethyl silicate, dimethyl maleate, diethyl maleate and dioctyl phthalate.

As components (E), preferred are the organometallic compounds, and more preferred are tetra-n-butoxyzirconium, bis(acetyl-acetonate)-titanium-di-i-propylate, ethylaceto-acetate-aluminum-di-i-propylate and tris(ethylacetoacetate)-aluminum described above.

Components (E) can be used either alone or as a mixture of two or more of them, and can also be used as a mixture with zinc compounds or other reaction retardants.

Component (E) may also be added in preparing the composition or at a stage where a coating film is formed or at both the stages of the preparation of the composition and the formation of the coating film.

The amount of component (E) used is usually from 0 part to 100 parts by weight, preferably from 0.005 part to 80 parts by weight, and more preferably from 0.01 part to 50 parts by weight, based on 100 parts by weight of composition. When the amount of component (E) used exceeds 100 parts by weight, a partial gel is produced in the composition, which caused a tendency to deteriorate the smoothness of the coating film.

Component (F)

Component (F) is at least one selected from the group consisting of a β-diketone and/or a β-keto ester represented by the following general formula (6), a carboxylic acid compound, a dihydroxy compound, an amine compound and an oxyaldehyde compound.

$$R^6COCH_2COR^7 \quad (6)$$

wherein, $R^6$ and $R^7$ each have the same meanings as given for $R^6$ and $R^7$ of the above-mentioned general formula (5) representing organometallic compound (5).

Such component (F) is preferably used in combination, particularly when the organometallic compound, etc. is used as the above-mentioned component (E).

Component (F) serves as a stability enhancing agent for the composition. That is to say, it is presumed that component (F) coordinates to a metallic atom in the organometallic compound, etc. to appropriately control the action for promoting the co-condensation reaction of the above-mentioned components (A) and (B) according to the organometallic compound, etc., thereby acting so as to further improve the storage stability of the resulting composition.

Specific examples of components (F) include acetylacetone, methyl acetoacetate, ethyl acetoacetate, n-propyl acetoacetate, i-propyl acetoacetate, n-butyl acetoacetate, sec-butyl acetoacetate, t-butyl acetoacetate, hexane-2,4-dione, heptane-2,4-dione, heptane-3,5-dione, octane-2,4-dione, nonane-2,4-dione, 5-methylhexane-2,4-dione, malonic acid, oxalic acid, phthalic acid, glycolic acid, salicylic acid, aminoacetic acid, iminoacetic acid, ethylenediaminetetraacetic acid, glycol, catechol, ethylenediamine, 2,2-bipyridine, 1,10-phenanthroline, diethylenetriamine, 2ethanolamine, dimethylglyoxime, dithizone, methionine and salicylaldehyde. Of these, preferred are acetylacetone and ethyl acetoacetate.

Components (F) can be used either alone or as a mixture of two or more of them.

The amount of component (F) used is usually 2 moles or more, and preferably from 3 moles to 20 moles, based on mole of organometallic compound in the above-mentioned organometallic compound, etc. In this case, when the amount of component (F) used is less than 2 moles, the effect of improving the storage stability of the resulting composition tends to become insufficient.

Component (G)

Component (G) is a powder and/or a sol or a colloid of an inorganic compound, and mixed according to the desired properties of the coating film.

Specific examples of the compounds constituting component (G) include $SiO_2$, $TiO_2$, $Al_2O_3$, $Al(OH)_3$, $Sb_2O_5$, $SnO_2$, $Sn—In_2O_3$, $In_2O_3$, $CeO_2$, $3Al_2O_3.2SiO_2$, $BaTiO_3$, $ZrO_2$ and $ZnO$. These components (G) can be used either alone or as a mixture of two or more of them.

As the existing forms of component (G), there are a powder, an aqueous sol or colloid in which component (G) is dispersed in water, and a solvent sol or colloid in which component (G) is dispersed in a polar solvent such as isopropyl alcohol or a nonpolar solvent such as toluene. The solvent sol or colloid may be further diluted with water or a solvent for use depending on the dispersibility of the semiconductor, or component (G) may be surface treated for improving the dispersibility.

When component (G) is in the aqueous sol or colloid form, or in the solvent sol or colloid form, the average particle size thereof is 500 nm or less, and preferably 200 nm or less, and the solid concentration thereof is preferably 40% by weight or less.

As a method for adding component (G) to the composition, component (G) may be added after the preparation of the composition or may be added in preparing the composition to allow component (G) to be co-hydrolyzed and co-condensed with the above-mentioned components (A) and (B).

The amount of component (G) used is usually from 0 part to 500 parts by weight, and preferably from 0.1 part to 400 parts by weight, in terms of the solid content, based on 100 parts by weight of composition.

Further, the thermosetting compositions of the present invention can also contain other additives such as surfactants, silane coupling agents, titanium coupling agents and dyes, as well as known dehydrating agents including component (D) described later, such as methyl orthoformate, methyl orthoacetate and tetraethoxysilane; dispersing agents such as poly(oxyethylene alkyl ethers), poly(oxyethylene alkyl phenyl ethers), poly-(oxyethylene esters of fatty aids), poly(carboxylic acid)polymer surfactants, polycarboxylates, polyphosphates, polyacrylates, polyamide esters and polyethylene glycol; thickening agents including cellulose derivatives such as methyl cellulose, ethyl cellulose, hydroxyethyl cellulose, hydroxypropyl cellulose and hydroxypropylmethyl cellulose, castor oil derivatives and ferrosilicates; inorganic foaming agents such as ammonium carbonate, ammonium bicarbonate, ammonium nitrite, sodium boron hydride and calcium azide; and organic foaming agents including azo compounds such as azobisisobutyronitrile, hydrazine compounds such as diphenylsulfone-3,3'-disulfohydrazine, semicarbazide compounds, triazole compounds and N-nitroso compounds, as desired.

Still further, leveling agents can be added for more improving the coating performance of the compositions. Of such leveling agents, fluorine leveling agents include, for example, BM1000 and BM1100 (trade names, hereinafter the same) manufactured by BM-Chemie, Efca 772 and Efca 777 manufactured by Efca Chemicals, a FLORENE series manufactured by Kyoeisha Kagaku Co., an FC series of SUMITOMO 3M LIMITED and a FLUONAL TF series of Toho Chemical Industry Co., Ltd. Silicone leveling agents include, for example, a BYK series manufactured by BYK Chemie, a Sshmego series of Sshmegmann and Efca 30, Efca 31, Efca 34, Efca 35, Efca 36, Efca 39, Efca 83, Efca 86 and Efca 88 manufactured by Efca Chemicals. Ether or ester leveling agents include, for example, Carphynol of Nisshin Kagaku Kogyo Co., Ltd. and EMARGEN and HOMOGENOL manufactured by Kao Corporation.

Compounding of such leveling agents improves the finished appearance of coating films and allows uniform coating also in the formation of thin films.

The amount of the leveling agent used is preferably from 0.01% to 5% by weight, and more preferably from 0.02% to 3% by weight, based on the whole composition.

As a method for adding the leveling agent, it may also be added in preparing the composition or at a stage where a coating film is formed or at both the stages of the preparation of the composition and the formation of the coating film.

In preparing the composition of the present invention, when component (E) and component (F) are not used, there is no particular limitation on the method for mixing each component. However, when component (E) and component (F) are used, a method is preferably employed in which a mixture of the components excluding component (F) is obtained, followed by addition of component (F) thereto.

In the composition of the present invention, the maximum size of particles contained therein is 2 $\mu$m or less, and the number of particles having a size of 0.2 $\mu$m to 2 $\mu$m is 1,000 particles/ml or less. The particles contained in the composition have various distorted shapes, as well as a spherical shape, and the above-mentioned size of particles means the diameter thereof for the spherical shape, and the maximum diameter thereof for the distorted shapes.

For decreasing the number of foreign matter contained in the above-mentioned composition and improving the smoothness of the cured product, filtration may be carried out. There is no particular limitation on the filtration method. However, preferred are natural filtration, filtration under pressure, filtration under reduced pressure and centrifugal filtration, and more preferred are filtration under pressure and filtration under reduced pressure. Although there is no particular limitation on the kind of filter, preferred are membrane or capsule type filters of resins such as polypropylene (PP), polyethylene (PE), polycarbonate (PC) and polytetrafluoroethylene (PTFE), cellulose, glass and stainless steel (SUS). In particular, when an organic solvent is used as a solvent, a capsule filter of PP or PTFE is preferred, and that of PTFE is more preferred. The pore size of the filter is preferably 5 $\mu$m or less, and more preferably 1 $\mu$m or less.

When the compositions of the present invention are applied onto the substrates, coating layers having a thickness of about 0.05 $\mu$m to about 40 $\mu$m in one application or a thickness of about 0.1 $\mu$m to about 80 $\mu$m in two or three applications can be formed using coaters such as a roll coater, a flow coater, a centrifugal coater and an ultrasonic coater, or by coating methods such as dip coating, flow coating, spray coating, a screen process, electrodeposition, vapor deposition, spattering, soldering, ion plating and electroplating. In particular, preferred examples of the coaters for obtaining the smooth cured products include a roll coater, a direct gravure coater, offset gravure coater, arc gravure coater, a blade coater, a rod coater, air knife coater, a comma coater, a comma reverse coater, a U comma coater, a lip reel coater, a bottom reverse coater, a kiss coater, a squeeze roll coater, a top field reverse coater, a floating knife coater, a belt knife coater, a nozzle field reverse coater, a jet coater, a bill blade coater, a Bali-bar:roll blade coater, a by-dwell time blade coater, a short-dwell coater, a hydro-bar coater, a two-stream coater, a fountain coater, a fountain reverse coater, a gate roll coater, a bead coater, a micro gravure coater, a micro reverse gravure coater and a roll flex coater.

After applied by the above-mentioned coating methods, the compositions of the present invention are dried at room temperature, or heated at a temperature of about 30° C. to about 200° C. for about 0.2 second to about 60 minutes to dry them, thereby conducting heat curing to form the cured products (coating films). The coating films (release, nonadhesive cured products) can be formed on various substrates.

The thickness of the cured product (coating film) can be appropriately selected depending on its use. However, when the substrates are plastics, it is preferably from 0.1 $\mu$m to 40 $\mu$m, more preferably from 0.2 $\mu$m to 20 $\mu$m, and particularly preferably from 0.3 $\mu$m to 10 $\mu$m. Less than 0.1 $\mu$m results in a failure to obtain a continuous film, which causes a decrease in film strength, whereas exceeding 40 $\mu$m results in a failure to obtain film follow-up properties (crack resistance) of the coating film.

When the coating films of present invention are used as the release films for the production of ceramic condensers, the thickness thereof is the same as with the above-mentioned cured products. However, it is preferably from 0.3 $\mu$m to 10 $\mu$m.

Materials for the substrates to which the compositions of the present invention are applicable include, for example, metals such as iron, aluminum and stainless steel; shaped articles of plastics such as phenol resins, epoxy resins, polyesters, polycarbonates, polyethylene, polypropylene and ABS resins (acrylonitrilebutadiene-styrene resins); films of plastics such as polyethylene, polypropylene, polyvinyl alcohol, polycarbonates, polyethylene terephthalate, polyethylene naphthalate, acrylic resins, PTFE, polyurethanes and polyimides; and glass. The substrates are preferably in the film form.

When the coating films of present invention are used as the release films for the production of ceramic condensers, materials for the substrates are the same as with the above-mentioned cured products. However, preferred are polyethylene terephthalate and polyethylene naphthalate.

The substrates can also be preliminarily surface treated for base preparation, improvement in Adhesiveness, sealing of porous substrates, smoothing and patterning.

The surface treatments to the metallic substrates include, for example, degreasing, plating treatment, chromate treatment, flame treatment, coupling treatment and primer treatment. The surface treatments to the plastic substrates include, for example, blast treatment, treatment with chemicals, degreasing, flame treatment, oxidation treatment, vapor treatment, corona discharge treatment, ultraviolet irradiation treatment, electron beam treatment, radiation treatment, plasma treatment, ion treatment and primer treatment.

There is no particular limitation on the kind of primer, as long as it has the function of enhancing the Adhesiveness between the substrate and the composition, and it is selected depending on the kind and application purpose of substrate. The primers can be used either alone or as a mixture of two or more of them.

Examples of the primers include alkyd resins, aminoalkyd resins, epoxy resins, polyesters, acrylic resins, urethane resins, fluororesins, acrylic silicone resins, acrylic emulsions, epoxy emulsions, polyurethane emulsions, polyester emulsions and compositions according to claims 1 to 5 of the present invention. When the Adhesiveness is required between the substrates and the coating films under severe conditions, various functional groups can also be imparted to these primers. Such functional groups include, for example, a hydroxyl group, a carboxyl group, a carbonyl group, an amido group, an amine group, a glycidyl group, an alkoxysilyl group, an ether bond and an ester bond.

The arithmetical mean roughness of a surface of the substrate used in the present invention is preferably 0.5 $\mu$m or less, more preferably 0.3 $\mu$m or less, and particularly preferably 0.2 $\mu$m or less. When the arithmetical mean roughness exceeds 0.5 $\mu$m, the smoothness is deteriorated, resulting in a failure to obtain ceramic condenser characteristics.

The arithmetical mean roughness can be measured, for example, with a non-contact three-dimensional measuring device, NH-3, manufactured by MITAKAKOHKI Co., Ltd.

The maximum value of the height of projections on the surface of the substrate is preferably 2 $\mu$m or less, more preferably 1.5 $\mu$m or less, and particularly preferably 1 $\mu$m or less. When the maximum height of projections thereon exceeds 2 $\mu$m, the rejection rate is increased. The maximum height of projections thereon can be measured with an NH-3 non-contact three-dimensional measuring device manufactured by MITAKAKOHKI Co., Ltd., similarly to the arithmetical mean roughness.

The substrate used in the present invention is preferably a film whose surface has an arithmetical mean roughness of 0.5 $\mu$m or less and/or a maximum height of projections thereon of 2 $\mu$m or less.

Although the arithmetical mean roughness and/or the maximum height of projections on the surface of the substrate of the release film for the production of a ceramic condenser is the same as with the above-mentioned cured product, the surface preferably has an arithmetical mean roughness of 0.5 $\mu$m or less and/or a maximum height of projections thereon of 2 $\mu$m or less.

The above-mentioned composition of the present invention is used as a thermosetting composition. However, this composition can contain photoacid generating agent (C) and/or dehydrating agent (D), thereby using the composition as a photo-curing composition.

Photoacid Generating Agent (C)

(1) Definition

Photoacid generating agent (C) is defined as a compound which can release an acidic active substance which can photo cure (crosslink) the hydrolytic organosilane, component (B), by irradiation of energy rays such as light.

The light energy rays irradiated for decomposing the photoacid generating agents to generate cations include visible light, ultraviolet rays, infrared rays, X-rays, $\alpha$-rays, $\beta$-rays and $\gamma$-rays. However, the ultraviolet rays are preferably used, because they have a constant level of energy and high (rapid) curing rate, and irradiation devices thereof are relatively inexpensive and small in size.

In the production of the release, non-adhesive cured products of the present invention, radical generating agents described later are also preferably used in combination with the photoacid generating agents in the compositions. Radicals, neutral active substances, do not accelerate the condensation reaction of silanol groups. However, using radical generating agents, when component (B) has radical polymerizable functional groups therein, the polymerization of the functional group can be promoted. Accordingly, the photo-curing compositions can be cured more effectively.

(2) Kind of Photoacid Generating Agent

The kind of photoacid generating acid used in the present invention will be described below. The photoacid generating acids include onium salts having a structure represented by general formula (7) (compounds of the first group) and sulfonic acid derivatives having a structure represented by general formula (8) (compounds of the second group).

$$[R^8{}_a R^9{}_b R^{10}{}_c R^{11}{}_d W]^{+m}[MZ_{m+n}]^{-m} \qquad (7)$$

wherein a cation is an onium ion; W is S, Se, Te, P, As, Sb, Bi, O, I, Br, Cl or —N≡N; $R^8$ to $R^{11}$, which may be the same or different, are organic groups; a, b, c and d are each integers of 0 to 3, and (a+b+c+d) is equal to the valence of W; M is a metal or a metalloid constituting a central atom of halide complex [$MX_{m+n}$], such as B, P, As, Sb, Fe, Sn, Bi, Al, Ca, In, Ti, Zn, Sc, V, Cr, Mn or Co; Z is a halogen atom such as F, Cl or Br, or an aryl group; m is the net electrical charge of a halide complex ion; and n is the valence of M.

$$Q_s\text{—}[S(\!=\!O)_2\text{—}R^{12}]_t \qquad (8)$$

wherein Q is a monovalent or divalent organic group; $R^{12}$ is a monovalent organic group having 1 to 12 carbon atoms; a suffix s is 0 or 1; and a suffix t is 1 or 2.

First, the onium salts, the compounds of the first group, are compounds releasing acidic active substances by receiving light. Of such compounds of the first group, more effective onium salts are aromatic onium salts, and more preferably diaryliodonium salts represented by the following general formula (9):

$$[R^{13}\text{—}Ar^1\text{—}I^+\text{—}Ar^2\text{—}R^{14}][Y^-] \qquad (9)$$

wherein $R^{13}$ and $R^{14}$, which may be the same or different, are each monovalent organic groups; at least one of $R^{13}$ and $R^{14}$ has an alkyl group having 4 or more carbon atoms; $Ar^1$ and $Ar^2$, which may be the same or different, are each aromatic groups; and $Y^-$ is a monovalent anion selected from fluoride anions of the groups 3 and 5 in the periodic table, or from $ClO_4{}^-$, $CF_3{}^-$ and $SO_3{}^-$.

Examples of the sulfonic acid derivatives represented by general formula (8) as the compounds of the second group include disulfones, disulfonyldiazomethane derivatives, disulfonylmethane derivatives, sulfonylbenzoylmethane derivatives, imide sulfonate derivatives, benzoin sulfonate derivatives, sulfonate derivatives of 1-oxy-2-hydroxy-3-propyl alcohol, pyrogallol trisulfonate derivatives and benzyl sulfonate derivatives.

Of the sulfonic acid derivatives represented by general formula (8), more preferred are the imide sulfonate derivatives, and of the imide sulfonate derivatives, still more preferred are trifluoromethyl sulfonate derivatives.

(3) Amount of Photoacid Generating Agent Added

The amount of the photoacid generating agent added to the photo-curing composition (the ratio of the photoacid generating agent contained) will be described below.

There is no particular limitation on the amount of the photoacid generating agent used. However, it is preferred that the amount is usually within the range of 0.1 part to 15 parts by weight, based on 100 parts by weight of organosilane (1) constituting component (B). When the amount of the photoacid generating agent added is less than 0.1 part by weight, the photo-curing properties are deteriorated, resulting in a failure to obtain sufficient curing rate in some cases. On the other hand, when the amount of the photoacid generating agent added exceeds 15 parts by weight, the weather resistance and heat resistance of the resulting cured product are deteriorated in some cases.

It is therefore more preferred that the amount of the photoacid generating agent added is within the range of 1 part to 10 parts by weight, based on 100 parts by weight of organosilane (1), from the viewpoint of a better balance between the photo-curing properties and the weather resistance of the resulting cured product.

Dehydrating Agent (D)

(1) Definition

The dehydrating agent used in the photo-curing composition of the present invention is defined as a compound converting water to a substance other than water by chemical reaction, or a compound preventing the influence of water on the photo-curing properties and the storage stability by physical adsorption or inclusion.

That is to say, the comprehension of such a dehydrating agent can improve the conflicting characteristics of the storage stability and the photo-curing properties without impairing the weather resistance and heat resistance of the photo-curing composition. As a reason for above, it is considered that the dehydrating agent effectively absorbs water entered from the outside, thereby improving the storage stability of the photo-curing composition, whereas in the condensation reaction which is the photo-curing reaction, the dehydrating agent effectively absorbs subsequently water produced, thereby improving the photo-curing properties of the photo-curing composition.

(2) Kind of Dehydrating Agent

The kind of dehydrating agent used in the photo-curing composition will be described below. Although there is no particular limitation on the kind of dehydrating agent, the organic compound dehydrating agent is preferably at least one compound selected from the group consisting of a carboxylic acid ester, an acetal (including a ketal) and a carboxylic acid anhydride. Further, a ceramic powder having a dehydrating function is also preferably used as an inorganic compound dehydrating agent. These dehydrating agents exhibit excellent dehydrating effect and can efficiently exert their function by adding them in small amounts.

The carboxylic acid esters as the dehydrating agents are selected from carboxylic acid orthoesters and carboxylic acid silyl esters.

Preferred examples of the carboxylic acid orthoesters include methyl orthoformate, ethyl orthoformate, propyl orthoformate, butyl orthoformate, methyl orthoacetate, ethyl orthoacetate, propyl orthoacetate, butyl orthoacetate, methyl orthopropionate and ethyl orthopropionate. Of these carboxylic acid orthoesters, orthoformates are particularly preferred as the dehydrating agents used in the present invention, from the viewpoints of excellent dehydrating effect and excellent improving ability of storage stability and photo-curing properties of the photo-curing composition.

Preferred examples of the carboxylic acid silyl esters include trimethylsilyl acetate, tributylsilyl acetate, trimethylsilyl formate and trimethylsilyl oxalate.

Further, preferred examples of the acetals include acetone dimethyl acetal, acetone diethyl acetal, methyl ethyl ketone dimethyl acetal, methyl ethyl ketone diethyl acetal, cyclohexanone dimethyl acetal and cyclohexanone diethyl acetal. These acetals exhibit excellent dehydrating effect and can more improve the storage stability and photo-curing properties of the photo-curing compositions.

Still further, preferred examples of the carboxylic acid anhydrides include formic anhydride, acetic anhydride, succinic anhydride, maleic anhydride, phthalic anhydride, benzoic anhydride and acetic benzoic anhydride. Acetic anhydride and succinic anhydride are particularly excellent, so that they are particularly preferred.

Furthermore, preferred examples of the ceramic powders having a dehydrating function include silica gel particles, alumina particles, silica alumina particles, activated clay and zeolite. These ceramic powders have strong affinity for water, and can exert excellent dehydrating effect.

(3) Amount of Dehydrating Agent Added

The amount of the dehydrating agent added to the photo-curing composition will be described below.

There is no particular limitation on the amount of the dehydrating agent used. However, it is preferred that the amount is usually within the range of 0.1 part to 100 parts by weight, based on 100 parts by weight of organosilane (1) constituting component (B). When the amount of the dehydrating agent added is less than 0.1 part by weight, the effect of adding the dehydrating agent is poor, resulting in poor improving of the storage stability and the photo-curing properties in some cases. On the other hand, when the amount of the dehydrating agent added exceeds 100 parts by weight, the effect of improving the storage stability and the photo-curing properties is saturated in some cases.

Accordingly, the amount of the dehydrating agent added is preferably within the range of 0.5 part to 50 parts by weight, and more preferably within the range of 1 part to 10 parts by weight, based on 100 parts by weight of organosilane (1).

Other Additives

The photo-curing polymer compositions of the present invention can further contain additives such as radical photopolymerization initiators, photosensitizers, organic solvents, polymerization inhibiters, polymerization initiating assistants, leveling agents, wetting improvers, surfactants, plasticizers, ultraviolet absorbers, antioxidants, antistatic agents, silane coupling agents and component (G) described above, within such a range that the object and effect of the present invention are not impaired.

(1) Methods for Forming Cured Products by Photo-Curing

Also when the cured products are formed from the compositions of the present invention by photo-curing, coating is preferably employed, and coating methods are the same as with the above-mentioned thermosetting compositions.

There is also no particular limitation on the means for curing the photo-curing composition. However, it is preferred that the composition is irradiated with light having a wavelength of 150 nm to 400 nm, using a light source such as a high-pressure mercury lamp, a low-pressure mercury lamp, a metal halide lamp or an excimer lamp. Further, it is also preferred that the photo-curing composition is irradiated with a laser beam or focused light obtained by use of a lens or a mirror, with scanning of the laser beam or the focused light. Furthermore, it is also preferred that the composition is irradiated with unfocused light through a mask having a light transmission area of a specified pattern, or with light through specified optical fibers in a light guide member comprising a number of optical fibers grouped together.

(2) Thickness

There is no particular limitation on the thickness of the cured product (coating film) obtained by photo-curing, and it is the same as with the above-mentioned cured product obtained by heat curing.

Methods for Producing Cured Products of Photo-Curing Compositions

Methods for producing the cured products from the photo-curing compositions of the present invention comprise a first step of forming the above-mentioned photo-curing compositions on substrates (hereinafter also referred to as a forming step) and a second step of curing the photo-curing compositions by exposure using an exposure device (hereinafter also referred to as an exposure step)

(1) First Step

In the first step, the forming methods and the thickness are as described above. However, it is preferred that the photo-curing compositions are preliminarily heated (pre-baked) at a temperature of 100° C. to 150° C. after formation thereof. Volatile components contained in the photo-curing compositions can be effectively removed by preheating the photo-curing compositions under such conditions to prevent the shape of formed articles of the photo-curing compositions from being loosed. Further, silanol of organosilane (1) constituting component (B) can be allowed to partly react, and can also improve the adhesiveness to the substrates and the resistance to chemicals (developing agents) in development.

However, preheating is conducted preferably at a temperature of 110° C. to 140° C., more preferably at a temperature of 115° C. to 130° C. so that development characteristics are not conversely deteriorated by excessive heating.

Further, the preheating time is preferably determined in consideration of the heating temperature. When the compositions are preliminarily heated at a temperature of 100° C. to 150° C., the heating time is preferably from 1 minute to 20 minutes. When the heating time is less than 1 minute, the reaction of silanol becomes inhomogeneous in some cases. On the other hand, when the preheating time exceeds 10 minutes, silanol sometimes reacts excessively to result in the difficulty of high-precision development using developing solutions. Accordingly, the preheating time is preferably within the range of 2 minutes to 15 minutes, and more preferably within the range of 3 minutes to 10 minutes.

There is no particular limitation on the preheating means, and for example, an oven or an infrared lamp can be used.

(2) Second Step

Preferred examples of the photo-curing methods in the second step include pattern exposure of the photo-curing composition to unfocused light through a photo-mask having a specified pattern, and pattern exposure by light irradiation from only optical fibers corresponding to a pattern of a photo-mask, using a light guide member comprising a number of optical fibers grouped together, not to mention photo-curing by whole area exposure.

Such pattern exposure can form a photo-cured area cured by exposure and an uncured photo-curing composition area not exposed, with high precision. Specifically, it has been confirmed that an exposed area of the substrate can be formed with good reproducibility by development after photo-curing, when the minimum line width at a line/space ratio of a pattern of 50/50 is within the range of 10 $\mu$m (line/space=10 $\mu$m/10 $\mu$m) or more, more preferably 30 $\mu$m, and still more preferably 50 $\mu$m. Accordingly, only the uncured photo-curing composition area can be easily wet developed (removed) with a developing solution, and the exposed area of the substrate, that is to say, an area on which no cured product is provided can be easily formed for a short period of time. Utilizing such an exposed area of the substrate, therefore, a desired member can be firmly adhered and fixed.

In the second step, it is also preferred that the release, non-adhesive products, the photo-cured products, are further heated. In that case, they are preferably heated at a temperature of 25° C. to 200° C. which is lower than the decomposition starting temperature of the substrates or the coating films, for 5 minutes to 72 hours. Cured products (laminates) more excellent in heat resistance and weather resistance can be obtained by heating the cured products as described above.

When the cured product (coating film) produced using the thermosetting and/or photo-curing composition of the present invention is provided in plural layers to form a multilayer structure, the thickness thereof is preferably the number of layers times the preferred thickness of the film at the time when the film is used as one layer. For example, when the cured product is formed in two layers, the total thickness thereof is preferably within the range of 0.2 $\mu$m to 80 $\mu$m.

Laminates

The laminates of the present invention are laminates in which the above-mentioned cured products (coating films) are formed on surfaces of the substrates. The laminates may be any, as long as they comprise at least the substrates and the cured products, and include various modifications. Examples thereof include release films for the production of ceramic condensers in which substrate films are laminated with the cured products of the present invention.

The arithmetical mean roughness of a surface of the cured product of the present invention is preferably 0.2 $\mu$m or less, more preferably 0.15 $\mu$m or less, and particularly preferably 0.1 $\mu$m or less. When the arithmetical mean roughness exceeds 0.2 $\mu$m, the smoothness is deteriorated to cause a reduction in ceramic condenser characteristics in the case of the release film for the production of a ceramic condenser.

The residual hydroxyl group concentration of the surface of the cured product of the present invention is preferably 10% or less, more preferably 8% or less, and particularly preferably 5% or less. When the hydroxyl group concentration exceeds 10%, the curing properties of the composition of the present invention are deteriorated.

An infrared absorption spectrum is used for the measurement of the hydroxyl groups. The coefficient of dynamic friction of the surface of the cured product is preferably 0.5 or less, more preferably 0.4 or less, and particularly preferably 0.3 or less. When the coefficient of dynamic friction exceeds 0.5, the coating film obtained by coating the composition of the present invention on a film is deteriorated in slipperiness in taking up it.

Further, it is preferred that the cured products of the present invention have a release, non-adhesive function. The releasability is evaluated, for example, by applying a solution of a butyral resin in toluene (solid concentration: 50%) so as to give a thickness of 50 $\mu$m after drying, and conducting a 180-degree peeling test in accordance with JIS K6854.

When the coating films of present invention are used as the release films for the production of ceramic condensers, the arithmetical mean roughness, the hydroxyl group concentration, the coefficient of dynamic friction and the release, non-adhesive function of the surface are the same as with the above-mentioned cured product. Preferably, however, the hydroxyl group concentration is 10% or less, and the coefficient of dynamic friction is 0.5 or less. As to the releasability, it is preferred that the whole film is released.

The polar term of surface free energy of the cured product of the present invention is determined from the equation of D. K. Owens and R. C. Wendt, measuring the contact angles of water and methylene iodide. The polar term is preferably 5 or less, more preferably 3 or less, and particularly preferably 2 or less. When the polar term exceeds 5, the release, non-adhesive function is not exhibited.

The above-mentioned cured products may be produced on the surfaces of the substrate films having an arithmetical mean roughness of 0.5 $\mu$m or less and/or a maximum height of projections thereon of 2 $\mu$m or less and 1,000 projections/m$^2$ or less of projections having a height of 0.2 $\mu$m to 2 $\mu$m to form laminates whose surfaces have an arithmetical mean roughness of 0.2 $\mu$m or less and/or a maximum height of projections thereon of 2 $\mu$m or less and 500 projections/m$^2$ or less of projections having a height of 0.2 $\mu$m to 2 $\mu$m.

The number of projections having a height of 0.2 $\mu$m to 2 $\mu$m on the surface of the above-mentioned substrate film is preferably 1,000 projections/m$^2$ or less, more preferably 800 projections/m$^2$ or less, and particularly preferably 600 projections/m$^2$ or less. When the number of projections having a height of 0.2 $\mu$m to 2 $\mu$m exceeds 1,000 projections/m$^2$, the smoothness of the cured product is deteriorated.

The maximum height of projections on the surface of the above-mentioned substrate film is preferably 2 $\mu$m or less, more preferably 1.5 $\mu$m or less, and particularly preferably 1 $\mu$m or less. When the maximum height of projections on the surface of the above-mentioned substrate film exceeds 2 $\mu$m, the smoothness is deteriorated to increase the rejection rate. Further, the number of projections having a height of 0.2 $\mu$m to 2 $\mu$m on the surface of the above-mentioned cured product is preferably 500 projections/m$^2$ or less, more preferably 400 projections/m$^2$ or less, and particularly preferably 300 projections/m$^2$ or less. When the number of projections having a height of 0.2 $\mu$m to 2 $\mu$m on the surface of the cured product exceeds 500 projections/m$^2$, the rejection rate is increased.

Furthermore, the thickness of the cured product is preferably 40 $\mu$m or less, more preferably 20 $\mu$m or less, and particularly preferably 10 $\mu$m or less. When the film thickness exceeds 40 $\mu$m, the film follow-up properties (crack resistance) are deteriorated.

When the coating films of present invention are used as the release films for the production of ceramic condensers, the maximum height of projections thereon, the number of projections having a height of 0.2 $\mu$m to 2 $\mu$m and the film thickness thereof are the same as with the above-mentioned cured product, and the thickness of the film is preferably 40 $\mu$m or less, more preferably 20 $\mu$m or less, and particularly preferably 10 $\mu$m or less.

As described above, the compositions (thermosetting compositions and photo-curing compositions) of the present invention contain polymers having silicon atoms bonded to hydrolytic groups and/or hydroxyl groups, and can form the smooth coating films excellent in storage stability, excellent in durability such as heat resistance, wet resistance and weather resistance, having alkali resistance and chemical resistance, and having high hardness and mechanical strength such as wear resistance.

The polymer compositions of the present invention can form the coating films having high hardness, excellent in mechanical strength such as wear resistance, having good taking-up properties and difficult to be scratched even when no lubricants are contained, extremely smooth and having no difference in film thickness. Further, the polymer compositions of the present invention are excellent in storage stability without increasing foreign matter in long-term storage.

The cured products (coating films) of the present invention are useful as coating materials for photoelectronic materials, and are applicable to, for example, printed circuit boards, printed boards, green sheets, release coating materials and protective coating materials for the production of IC condensers, protective coating materials for solar cell modules, release coating materials and protective coating materials for the production of information displays, transfer sheets, fixing rolls for printing, pressure rolls, release materials, protective coating materials for the production of FPD (Flat Panel Display), protective coating materials for the production of Els (Electro Luminescence devices), and release coating materials for the production of an anisotropic electrical conducting layer. Above all, the cured products (coating films) are most suitable for the release films for the production of ceramic condensers such as IC condensers.

The invention will be illustrated with reference to examples in more detail below, but the following examples are not intended to limit the scope of the invention. Parts and percentages in the examples and comparative examples are on a weight basis, unless otherwise specified. Various measurements and evaluations in the examples and comparative examples were made as follows:

(1) Molecular Weight

A gel permiation chromatography (GPC) method was used under the following conditions.

Test sample: Tetrahydrofuran was used as a solvent. 1 g of a partial condensate of organosilane or 0.1 g of a silyl contained vinyl resin was dissolved in 100 cc of the tetrahydrofran to prepare a test sample.

Standard polystyrene: Standard polystyrene made by Pressure Chemical, U.S.A.

Apparatus: A high-temperature, high-speed gel permeation chromatogram (a model, 150-C ALC/GPC) by Waters, U.S.A.

Column: A model, Shodex A-80M (length 50 cm) by SHOWA DENKO K.K., Japan.

Measurement temperature: 40° C.

Flow rate: 1 cc/min.

(2) Filterability, Number of Foreign Matter and Storage Stability

Filtration was conducted through a PTFE capsule filter (filtration accuracy: 0.1 $\mu$m) under a pressure of 2 kgf/cm$^2$, thereby confirming filterability.

◯: Filterable

×: Unfilterable

As to the number of foreign matter, the integrated number of foreign matter having a size of 0.2 $\mu$m to 2 $\mu$m per ml was measured with a particle counter manufactured by RION Co., Ltd.

As to the storage stability test, measurements of the number of foreign matter were made in the same manner after storage at 25° C. for 3 months.

◯: The rate of increase of foreign matter was less than 150%.

Δ: The rate of increase of foreign matter was from 150% to less than 200%.

×: The rate of increase of foreign matter was 200% or more.

(3) Adhesiveness

A tape peeling test was conducted for three times by the cross-cut Adhesiveness test (100 cross cuts) according to JIS K5400, and Adhesiveness was based on an average number of the remained cross cut(s).

(4) Hardness

The hardness was measured based on the pencil hardness according to JIS K5400.

(5) Alkali Resistance

After a test piece was immersed in a saturated aqueous solution of calcium hydroxide for 60 days in room temperature, the state of a coating film was visually observed. A coating film having no change was evaluated as "good".

(6) Organic Chemical Resistance

Isopropyl alcohol was dropped in an amount of 2 cc onto a coating film, and wiped off with cloth after 5 minutes. Then, the state of the coating film was visually observed. A coating film having no change was evaluated as "good".

(7) Transparency

Each composition was applied onto quartz glass so as to give a dry thickness of 5 µm. Then, the permeability of visible light was measured with haze-gard plus (trade name) manufactured by BYK Gardner Co., Ltd., and evaluated on the basis of the following criteria:

⊚: The permeability exceeded 80%.

○: The permeability was from 60% to 80%.

Δ: The permeability was less than 60%.

(8) Coefficient of Dynamic Friction

The coefficient of dynamic friction was measured with an FRP-2000 friction abrasion tester manufactured by RHESCA Co., Ltd., imposing a load of 200 g at a revolution of 1 rpm at linear speed of 0.524.

(9) Wear Resistance

A friction abrasion test at 500 revolutions was carried out with a taper abrasion tester using a truck wheel cs-10 and imposing a load of 0.5 kg. Then, the difference in haze between before and after the test was determined, and evaluated on the basis of the following criteria:

○: The difference in haze was less than 10.

Δ: The difference in haze was from 10 to less than 20.

×: The difference in haze was 20 or more.

Haze was measured with haze-gard plus (trade name) manufactured by BYK Gardner Co., Ltd.,

(10) Arithmetical Mean Roughness (Smoothness)

The arithmetical mean roughness (µm) of a surface was evaluated with an NH-3 non-contact three-dimensional measuring device manufactured by MITAKAKOHKI Co., Ltd.

(11) Releasability

A solution of a butyral resin in toluene (solid concentration: 50%) was applied so as to give a thickness of 50 µm after drying, and a 180-degree peeling test was conducted in accordance with JIS K6854.

○: Wholly released.

Δ: Partially released.

×: Not released.

(12) Maximum Height

The maximum height of surface projections was evaluated with an NH-3 non-contact three-dimensional measuring device manufactured by MITAKAKOHKI Co., Ltd.

(13) Polar term of Surface Free Energy

The contact angle of water and the contact angle of methylene iodide were measured, and the polar term of surface free energy was determined from the equation of D. K. Owens and R. C. Wendt.

EXAMPLE 1

Preparation of Component (A) (Silyl Group- and Fluorine Group-Containing Vinyl Ether Polymer)

An atmosphere in a stainless steel autoclave equipped with an electromagnetic stirrer was sufficiently replaced by a nitrogen gas, and the autoclave was filled with 100 parts of methyl isobutyl ketone, 30 parts of ethyl vinyl ether, and 2 parts of a solution of VPS-1001N (manufactured by Wako Pure Chemical Industries, Ltd.) in methyl isobutyl ketone (solid concentration: 30%). The solution in the autoclave was cooled down to −50° C. with dry ice-methanol, and then oxygen in the system was removed by a nitrogen gas again. Then, 70 parts of hexafluoropropylene and 7 parts of vinyltrimethoxysilane were added thereto, and the temperature of the system was rose continuously. The pressure in the autoclave at the time when the temperature in the autoclave reached 60° C. was 5 kgf/cm$^2$. The polymerization reaction was continued for 20 hours by stirring while keeping the temperature of the reaction system at 60° C. When the pressure in the autoclave dropped down to 1.5 kgf/cm$^2$, the mixture was cooled down with water to stop the reaction. Thus, component (A-1) having a solid concentration of 30% was obtained. Molecular weight of (A-1) was 28,000.

EXAMPLE 2

Preparation of Component (A) (Silyl Group- and Fluorine Group-Containing Acrylic Polymer)

In a reactor equipped with a reflux condenser and a stirrer, 10.0 parts of 1H,1H,5H-octafluoropentyl methacrylate, 53.0 parts of methyl methacrylate, 5.7 parts of 2-ethylhexyl acrylate, 4.3 parts of butyl acrylate, 6.0 parts of cyclohexyl methacrylate, 11.3 parts of γ-methacryloxypropyltrimethoxysilane, 5.0 parts of 4-methacryloyloxy-1,2,2,6,6-pentamethylpiperidine, 75.0 parts of i-butyl alcohol, 50.0 parts of methyl ethyl ketone and 25 parts of methanol were placed and mixed, followed by heating to 80° C. with stirring. Then, a solution obtained by dissolving 4 parts of a solution of VPS-1001N in methyl ethyl ketone (solid concentration: 30%) into 10 parts of xylene, was added dropwise to this mixture for 30 minutes, followed by reaction at 80° C. for 5 hours. Thus, component (A-2) having a solid concentration of 40% was obtained. Molecular weight of (A-2) was 12,000.

EXAMPLE 3

Preparation of Component (A) (Silyl Group-Containing Acrylic Polymer)

In a reactor equipped with a reflux condenser and a stirrer, 51.4 parts of methyl methacrylate, 5.5 parts of 2-ethylhexyl acrylate, 6.0 parts of cyclohexyl acrylate, 11.3 parts of γ-methacryloxypropyltrimethoxysilane, 0.8 part of a caprolactone-modified acrylate, 20.0 parts of glycidyl methacrylate, 5.0 parts of 4-methacryloyloxy-1,2,2,6,6—pentamethylpiperidine, 75.0 parts of i-butyl alcohol, 50.0 parts of methyl ethyl ketone and 25.0 parts of methanol were placed and mixed, followed by heating to 80° C. with stirring. Then, a solution obtained by dissolving 4 parts of a solution of VPS-1001N in methyl ethyl ketone (solid concentration: 30%) into 10 parts of xylene was added dropwise to this mixture for 30 minutes, followed by reaction at 80° C. for 5 hours. Thus, component (A-3) having a solid concentration of 40% was obtained. Molecular weight of (A-3) was 9,000.

Reference Example 1

Preparation of Component (B) (Polysiloxane)

In a reactor equipped with a reflux condenser and a stirrer, 100 g of tetramethoxysilane were dissolved in 300 g of propylene glycol monopropyl ether to obtained a solution. The obtained solution was mixed with a three-one motor and the temperature of the system was maintained at 60° C. Then, a solution obtained by dissolving 2.1 g of maleic acid into 50 g of ion-exchanged water, was added dropwise to the above obtained solution for 1 hour, followed by reaction at 60° C. for 1 hour. Thus, component (b-1) having a solid concentration of 10% was obtained. Molecular weight of (b-1) was 2,000.

EXAMPLES 4 TO 17

In a reactor equipped with a reflux condenser and a stirrer, respective components shown in Tables 1 and 2 (excluding after-addition components) were placed and mixed. After addition of water, reaction was conducted at 60° C. for 4.5 hours. Then, the after-addition components were added, followed by cooling to room temperature. Thus, polymer compositions (d) to (q) of the present invention having a solid concentration of 20% were obtained.

The compositions obtained in Examples 1 to 17 were filtered through a PTFE capsule filter (filtration accuracy: 0.1 μm) under a pressure of 2 kgf/cm². Results of the evaluations are shown in Tables 1 and 2.

In the tables, "MTMS" indicates "methyltrimethoxysilane", "GPTS" indicates "3-glycidoxypropyltrimethoxysilane", "DMDMS" indicates "dimethyldimethoxysilane", "DiPEAAAl" indicates "ethylacetoacetate-aluminum-di-i-propylate", "iPA" indicates "i-propyl alcohol", and "MEK" indicates "methyl ethyl ketone". Also, in the tables, "MAC 2101" indicates silicon oligomers manufactured by Nippon Unicar Company Limited.

TABLE 1

| Example | 1 | 2 | 3 | 4 | 5 | 6 | 7 | 8 | 9 | 10 |
|---|---|---|---|---|---|---|---|---|---|---|
| Composition | a | B | c | d | e | f | g | h | i | j |
| Mixing Component (parts) | | | | | | | | | | |
| Component (A); | | | | | | | | | | |
| (A-1) | 100 | 0 | 0 | 70 | 77 | 70 | 0 | 0 | 176 | 410 |
| (A-2) | 0 | 100 | 0 | 0 | 0 | 0 | 54 | 0 | 0 | 0 |
| (A-3) | 0 | 0 | 100 | 0 | 0 | 0 | 0 | 54 | 0 | 0 |
| Component (B); | | | | | | | | | | |
| MTMS | 0 | 0 | 0 | 65 | 78 | 90 | 90 | 90 | 90 | 90 |
| GPTS | 0 | 0 | 0 | 35 | 22 | 10 | 10 | 10 | 10 | 10 |
| DMDMS | 0 | 0 | 0 | 0 | 0 | 0 | 0 | 0 | 0 | 0 |
| MAC 2101 | 0 | 0 | 0 | 0 | 0 | 0 | 0 | 0 | 0 | 0 |
| Solvent; | | | | | | | | | | |
| Water | 0 | 0 | 0 | 15 | 14 | 15 | 15 | 15 | 15 | 15 |
| MEK | 0 | 0 | 0 | 100 | 92 | 97 | 106 | 106 | 67 | 83 |
| IPA | 0 | 0 | 0 | 100 | 92 | 97 | 106 | 106 | 67 | 83 |
| Component (E); | | | | | | | | | | |
| DiPEAAl | 0 | 0 | 0 | 5 | 5 | 5 | 5 | 5 | 8 | 85 |
| After-Addition | | | | | | | | | | |
| Component (F); | | | | | | | | | | |
| Acetylacetone | 0 | 0 | 0 | 5 | 5 | 5 | 5 | 5 | 6 | 6 |
| Properties | | | | | | | | | | |
| Number of Foreign Matter (/ml) | 150 | 170 | 100 | 250 | 300 | 310 | 425 | 278 | 390 | 400 |
| Storage Stability | ○ | ○ | ○ | ○ | ○ | ○ | ○ | ○ | ○ | ○ |

TABLE 2

| Example | 11 | 12 | 13 | 14 | 15 | 16 | 17 |
|---|---|---|---|---|---|---|---|
| Composition | k | l | m | n | o | p | q |
| Mixing Component (parts) | | | | | | | |
| Component (A); | | | | | | | |
| (A-1) | 70 | 70 | 70 | 70 | 70 | 70 | 70 |
| (A-2) | 0 | 0 | 0 | 0 | 0 | 0 | 0 |
| (A-3) | 0 | 0 | 0 | 0 | 0 | 0 | 0 |
| Component (B); | | | | | | | |
| MTMS | 90 | 90 | 90 | 90 | 90 | 90 | 90 |
| GPTS | 0 | 0 | 0 | 0 | 10 | 10 | 10 |
| Terminal Methoxy Group Containing Methylpolysiloxane | 10 | 0 | 0 | 0 | 0 | 0 | 0 |
| Terminal Hydroxy Group Containing Methylpolysiloxane | 0 | 7 | 0 | 0 | 0 | 0 | 0 |
| DMDMS | 0 | 0 | 12 | 0 | 0 | 0 | 0 |
| MAC 2101 | 0 | 0 | 0 | 7 | 0 | 0 | 0 |
| (b-1) obtained in REF. EX. | 0 | 0 | 0 | 0 | 70 | 100 | 200 |
| Solvent; | | | | | | | |
| Water | 15 | 15 | 15 | 15 | 15 | 15 | 15 |
| MEK | 97 | 100 | 96 | 100 | 65 | 58 | 45 |
| iPA | 97 | 100 | 96 | 100 | 65 | 58 | 45 |
| Component (E); | | | | | | | |
| DiPEAAl | 5 | 5 | 5 | 5 | 5 | 5 | 5 |

TABLE 2-continued

| Example | 11 | 12 | 13 | 14 | 15 | 16 | 17 |
|---|---|---|---|---|---|---|---|
| Composition | k | l | m | n | o | p | q |
| *After-Addition* | | | | | | | |
| Component (F): | | | | | | | |
| Acetylacetone | 5 | 5 | 5 | 5 | 5 | 5 | 5 |
| *Properties* | | | | | | | |
| Number of Foreign Matter (/ml) | 260 | 243 | 280 | 288 | 320 | 350 | 280 |
| Storage Stability | ○ | ○ | ○ | ○ | ○ | ○ | ○ |

EXAMPLES 18 TO 34

A mixture of 100 parts of each polymer composition of the present invention obtained from the components shown in Tables 1 and 2 and 15 parts of a solution of bis(acetylacetonate)-titanium-di-i-propylate diluted with an equivalent mixture of i-propyl alcohol and methyl ethyl ketone (solid concentration: 20%) was applied onto a surface of a 50-μm thick PET film (manufactured by Toray Industries, Inc., arithmetical mean roughness: 0.1 μm), so as to give a dry thickness of 1 μm, and dried at 100° C. for 1 minute to prepare a coating film sample. For the resulting samples, the various evaluations were carried out. Results thereof are shown together in Tables 3 and 4.

EXAMPLES 35 TO 41

Preparation of Photo-Curing Compositions

In a vessel equipped with a stirrer and a distiller, 90 parts of methyltrimethoxysilane, 10 parts of glycidoxypropyltrimethoxysilane as (A-1) and component (B), which was prepared in Example 1, 5 parts of ethylacetoacetate-aluminum-di-i-propylate, 15 parts of ion-exchanged water having an electric conductivity of $8\times10^{-5}$ S·cm$^{-1}$, 100 parts of methyl ethyl ketone and 100 parts of i-propyl alcohol were mixed, and then, heated with stirring at a temperature of 60° C. for 5 hours, thereby conducting hydrolytic condensation. After the hydrolytic condensation reaction, acetylacetone as component (F) were mixed. Subsequently, interior temperature of the vessel was elevated to 80° C., methanol produced as a by-product by hydrolysis was removed by distillation, while adding dropwise methyl isobutyl ketone (hereinafter briefly referred to as "MIBK"). Finally, the solid content was adjusted to 22% to obtain a solution. The polystyrene-converted weight-average molecular weight of the resulting solution was 16,000.

Then, 3 parts of SI-100L (manufactured by SANSHIN CHEMICAL INDUSTRY Co., Ltd.) as a photoacid generating agent of component (C) and 5 parts of methyl orthoformate (manufactured by Wako Pure Chemical Industries, Ltd.) as a dehydrating agent of component (D) were added, based on 100 parts of the resulting solution (the total of the solid matter and the solvents), to obtain photo-curing composition A'. The resulting composition A' was filtered through a PTFE capsule filter (filtration accuracy: 0.1 μm) under a pressure of 2 kgf/cm$^2$.

TABLE 3

| Example | 18 | 19 | 20 | 21 | 22 | 23 | 24 | 25 |
|---|---|---|---|---|---|---|---|---|
| Composition | a | b | c | d | e | f | g | h |
| Adhesiveness (cross cuts/100) | 100 | 100 | 100 | 100 | 100 | 100 | 100 | 100 |
| Pencil Hardness | 4H | 4H | H | 4H | 4H | 2H | 2H | 2H |
| Alkali Resistance | Good | Good | Good | Good | Good | Good | Good | Good |
| Organic Chemical Resistance | Good | Good | Good | Good | Good | Good | Good | Good |
| Transparency | ⊚ | ⊚ | ⊚ | ⊚ | ⊚ | ⊚ | ⊚ | ⊚ |
| Coefficient of Dynamic Friction | 0.08 | 0.12 | 0.14 | 0.09 | 0.10 | 0.08 | 0.06 | 0.06 |
| Wear Resistance | ○ | ○ | ○ | ○ | ○ | ○ | ○ | ○ |
| Arithmetical Mean Roughness (μm) | 0.07 | 0.07 | 0.06 | 0.08 | 0.07 | 0.07 | 0.09 | 0.08 |
| Releasability | ○ | ○ | ○ | ○ | ○ | ○ | ○ | ○ |

TABLE 4

| Example | 26 | 27 | 28 | 29 | 30 | 31 | 32 | 33 | 34 |
|---|---|---|---|---|---|---|---|---|---|
| Composition | i | j | k | l | m | n | o | p | q |
| Adhesiveness (cross cuts/100) | 100 | 100 | 100 | 100 | 100 | 100 | 100 | 100 | 100 |
| Pencil Hardness | 4H | 4H | 4H | 4H | 4H | 4H | 4H | 5H | 5H |
| Alkali Resistance | Good | Good | Good | Good | Good | Good | Good | Good | Good |
| Organic Chemical Resistance | Good | Good | Good | Good | Good | Good | Good | Good | Good |
| Transparency | ⊚ | ⊚ | ⊚ | ⊚ | ⊚ | ⊚ | ⊚ | ⊚ | ⊚ |
| Coefficient of Dynamic Friction | 0.11 | 0.14 | 0.06 | 0.08 | 0.09 | 0.07 | 0.08 | 0.12 | 0.15 |
| Wear Resistance | ○ | ○ | ○ | ○ | ○ | ○ | ○ | ○ | ○ |
| Arithmetical Mean Roughness (μm) | 0.09 | 0.10 | 0.08 | 0.07 | 0.08 | 0.07 | 0.08 | 0.12 | 0.15 |
| Releasability | ○ | ○ | ○ | ○ | ○ | ○ | ○ | ○ | ○ |

Similarly, photo-curing compositions B' to F' were prepared. Results thereof are shown in Table 5.

TABLE 5

| Example | 35 | 36 | 37 | 38 | 39 | 40 | 41 |
|---|---|---|---|---|---|---|---|
| Composition | A' | B' | C' | D' | E' | F' | G' |
| Mixing Component (parts) | | | | | | | |
| Component (A); | | | | | | | |
| (A-1) | 70 | 70 | 70 | 70 | 0 | 0 | 70 |
| (A-2) | 0 | 0 | 0 | 0 | 54 | 0 | 0 |
| (A-3) | 0 | 0 | 0 | 0 | 0 | 54 | 0 |
| Component (B); | | | | | | | |
| MTMS | 90 | 90 | 90 | 90 | 90 | 90 | 90 |
| GPTS | 10 | 0 | 0 | 0 | 10 | 10 | 10 |
| Terminal Methoxy Group Containing Methylpolysiloxane | 0 | 0 | 7 | 0 | 0 | 0 | 0 |
| Terminal Hydroxy Group Containing Methylpolysiloxane | 0 | 0 | 0 | 7 | 0 | 0 | 0 |
| DMDMS | 0 | 12 | 0 | 0 | 0 | 0 | 0 |
| (b-1) obtained in REF. EX. | 0 | 0 | 0 | 0 | 0 | 0 | 70 |
| Solvent; | | | | | | | |
| Water | 15 | 15 | 15 | 15 | 15 | 15 | 15 |
| Methyl ethyl ketone | 100 | 96 | 100 | 100 | 106 | 106 | 65 |
| IPA | 100 | 96 | 100 | 100 | 106 | 106 | 65 |
| Component (E); | | | | | | | |
| DiPEAAl | 5 | 5 | 5 | 5 | 5 | 5 | 5 |
| After-Addition Component | | | | | | | |
| Component (C); | | | | | | | |
| SI-100L | 3 | 3 | 3 | 3 | 3 | 3 | 3 |
| Component (D); | | | | | | | |
| Methyl o-Formate | 5 | 5 | 5 | 5 | 5 | 5 | 5 |
| Component (F); | | | | | | | |
| Acetylacetone | 5 | 5 | 5 | 5 | 5 | 5 | 5 |
| Properties | | | | | | | |
| Filterability | ○ | ○ | ○ | ○ | ○ | ○ | ○ |
| Number of Foreign Matter (/ml) | 234 | 361 | 401 | 322 | 399 | 370 | 320 |
| Storage Stability | ○ | ○ | ○ | ○ | ○ | ○ | ○ |

EXAMPLES 42 TO 48

Photo-Curing Compositions and Evaluations Thereof (1) Photo-Curing Property Evaluation 1

An equivalent mixed solvent of MIBK and n-butanol was added to the resulting photo-curing composition (solution) to adjust the solid concentration to 3%. Then, the solution was applied onto a PET film (manufactured by Toray Industries, Inc., arithmetical mean roughness: 0.1 μm) by use of an applicator under atmospheric conditions to form a coating film.

Subsequently, the film was dried at room temperature (25° C.) for 2 minutes to obtain a coating film having a thickness of 0.5 μm. Then, the coating film thus obtained was irradiated with ultraviolet rays by use of a conveyer type high-pressure mercury lamp (2 kW) manufactured by OHKU Co., Ltd. so as to give exposures of 100 mJ/cm$^2$ (irradiation time: 1 second), 200 mJ/cm$^2$ (irradiation time: 2 seconds) and 300 mJ/cm$^2$ (irradiation time: 3 seconds), thereby forming a film under atmosphere. Similarly, the film was irradiated with the ultraviolet rays at a temperature of 25° C. in an atmosphere of nitrogen to form a film. For the resulting films, surface tackiness was examined by finger touch, and the photo-curing property was evaluated on the basis of the following criteria:

⊚: After an exposure of 100 mJ/cm$^2$, no surface tackiness was observed on the films.

○: After an exposure of 200 mJ/cm$^2$, no surface tackiness was observed on the films.

Δ: After an exposure of 300 mJ/cm$^2$, no surface tackiness was observed on the films.

×: After an exposure of 300 mJ/cm$^2$, surface tackiness was observed on the films.

Results thereof are shown in Table 6.

(2) Photo-Curing Property Evaluation 2

After the resulting photo-curing composition (solution) was stored at a temperature of 40° C. for 1 month and 3 months, respectively, a change in appearance (an increase in viscosity) was visually observed, and the photo-curing property of (1) described above was further measured. The photo-curing property after long-term storage was evaluated on the basis of the following criteria:

⊚: After an elapse of 3 months, no change in appearance and no change in the photo-curing property were observed.

○: After an elapse of 1 month, no change in appearance and no change in the photo-curing property were observed.

×: After an elapse of 1 month, a change in appearance or a change in the photo-curing property was observed.

Results thereof are shown in Table 6 as storage stability.

Evaluations of Adhesiveness, hardness, alkali resistance, organic chemical resistance, wet resistance, transparency, wear resistance and smoothness were the same as with the above-mentioned thermosetting compositions.

TABLE 6

| Example | 42 | 43 | 44 | 45 | 46 | 47 | 48 |
|---|---|---|---|---|---|---|---|
| Composition | A' | B' | C' | D' | E' | F' | G' |
| Photo-Curing Property Evaluation 1 | ⊚ | ⊚ | ⊚ | ⊚ | ⊚ | ⊚ | ⊚ |
| Photo-Curing Property Evaluation 2 | ⊚ | ⊚ | ⊚ | ⊚ | ⊚ | ⊚ | ⊚ |
| Adhesiveness (cross cuts/100) | 100 | 100 | 100 | 100 | 100 | 100 | 100 |
| Pencil Hardness | 4H | 4H | 4H | 4H | 2H | 2H | 4H |
| Alkali Resistance | Good | Good | Good | Good | Good | Good | Good |

TABLE 6-continued

| Example | 42 | 43 | 44 | 45 | 46 | 47 | 48 |
|---|---|---|---|---|---|---|---|
| Composition | A' | B' | C' | D' | E' | F' | G' |
| Organic Chemical Resistance | Good | Good | Good | Good | Good | Good | Good |
| Transparency | ⊚ | ⊚ | ⊚ | ⊚ | ⊚ | ⊚ | ⊚ |
| Coefficient of Dynamic Friction | 0.02 | 0.08 | 0.11 | 0.03 | 0.04 | 0.07 | 0.12 |
| Wear Resistance | ○ | ○ | ○ | ○ | ○ | ○ | ○ |
| Arithmetical Mean Roughness ($\mu$m) | 0.07 | 0.08 | 0.08 | 0.07 | 0.09 | 0.08 | 0.10 |

EXAMPLES 49 TO 52

The compositions prepared in Examples 1, 2, 6 and 7 were filtered through a PTFE capsule filter (filtration accuracy: 0.1 $\mu$m) under a pressure of 2 kgf/cm$^2$.

Further, 15 parts of a solution of bis(ethylacetoacetate)-titanium-di-i-propylate diluted with an equivalent mixture of i-propyl alcohol and methyl ethyl ketone (solid concentration: 20%) was added to 100 parts of a solution of each composition diluted with an equivalent mixture of i-propyl alcohol and methyl ethyl ketone to a solid concentration of 10%, and the resulting solution was applied onto a surface of a 50-$\mu$m thick PET film (manufactured by Toray Industries, Inc., arithmetical mean roughness: 0.1 $\mu$m), and dried at 100° C. for 1 minute to prepare a coating film sample. For the resulting samples, the various evaluations were carried out. Results thereof are shown in Table 7.

Comparative Example 3

An SiO$_2$ sol having an average particle size of 800 nm (solid concentration: 20%) (20 parts) was mixed with composition (b-2) to obtain composition (b-4).

For compositions (b-2) to (b-4), the various evaluations were carried out in the same manner as described above. Results thereof are shown in Table 7.

TABLE 7

| | Example | | | | Comparative Example | | |
|---|---|---|---|---|---|---|---|
| | 49 | 50 | 51 | 52 | 1 | 2 | 3 |
| Composition | a | b | f | g | b-2 | b-3 | b-4 |
| Properties | | | | | | | |
| Solid Concentration (%) | 5 | 5 | 10 | 10 | 5 | 5 | 5 |
| Number of Foreign Matter (/ml) | 150 | 170 | 310 | 425 | 310 | 900 | 2500 |
| Thickness of Film ($\mu$m) | 1.0 | 0.9 | 0.8 | 0.8 | 1.0 | 1.5 | 3.0 |
| Coefficient of Dynamic Friction | 0.08 | 0.12 | 0.08 | 0.06 | 0.9 | 0.7 | 0.4 |
| Surface of Cured Product ($\mu$m) | | | | | | | |
| Arithmetical Mean Roughness | 0.07 | 0.07 | 0.07 | 0.09 | 0.09 | 0.20 | 0.80 |
| Maximum Height | 0.8 | 0.4 | 0.5 | 1.0 | 0.8 | 3.5 | 8.5 |
| Releasability | ○ | ○ | ○ | ○ | ○ | ○ | ○ |
| Polar Term of Surface Free Energy | 1.1 | 0.8 | 1.2 | 0.9 | — | — | — |

Using the above-mentioned samples, ceramic condensers were produced. As a result, thin ceramic layers having extremely flat surfaces were obtained, and it was possible to produce multi-layered ceramic condensers.

Comparative Example 1

A curing agent CAT-PL-56 (0.05 part) was mixed with 100 parts of a solution of dimethylsiloxane (KS-847T manufactured by Shin-Etsu Chemical Co., Ltd.) diluted with toluene (solid concentration: 5%) to obtain composition (b-2).

Comparative Example 2

An SiO$_2$ sol having an average particle size of 500 nm (solid concentration: 20%) (20 parts) was mixed with composition (b-2) to obtain composition (b-3).

What is claimed is:

1. A polymer composition comprising (A) a polymer having a silicon atom bound to a hydrolytic group and/or a hydroxyl group, and which is obtained in the presence of a polymerization initiator having a recurring unit represented by the following general formula (2):

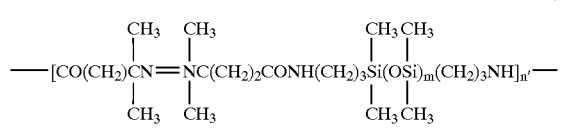

wherein m is from 5 to 250, and n' is from 4 to 40; and (B) at least one component selected from the group consisting of an organosilane represented by the following general formula (1), a hydrolyzate of the organosilane and a condensate of the organosilane:

wherein, $R^1$, which maybe the same or different when two or more $R^1$ groups are present, represents a monovalent organic group having 1 to 8 carbon atoms; X represents a halogen atom or an alkoxyl or acetoxyl group having 1 to 8 carbon atoms; and n is an integer of 0 to 2; in which the maximum size of particles contained in said composition is 2 μm, and the number of particles having a size of 0.2 μm to 2 μm in said composition is 1,000 particles/ml or less.

2. The polymer composition according to claim 1, wherein the polystyrene-converted weight-average molecular weight of component (A) is from 1,000 to 100,000.

3. The polymer composition according to claim 1, further comprising (C) a photoacid generating agent.

4. The polymer composition according to claim 1, further comprising (D) a dehydrating agent.

5. A cured product obtained by coating a substrate with the polymer composition according to claim 1, and subjecting the composition to heat curing and/or photo-curing.

6. The cured product according to claim 5, wherein a surface of the substrate has an arithmetical mean roughness of 0.5 μm or less and/or a maximum height of projections thereon of 2 μm or less.

7. The cured product according to claim 5, wherein the substrate is a film whose surface has an arithmetical mean roughness of 0.5 μm or less and/or a maximum height of projections thereon of 2 μm or less.

8. The cured product according to claim 5, wherein a surface of the cured product has an arithmetical mean roughness of 0.2 μm or less and/or a maximum height of projections thereon of 2 μm or less.

9. The cured product according to claim 5, wherein the surface of the cured product has a hydroxyl group concentration of 10% or less.

10. The cured product according to claim 5, wherein the surface of the cured product has a coefficient of dynamic friction of 0.5 or less.

11. The cured product according to claim 5, which has a release, non-adhesive function.

12. A laminate having the cured product composed of the polymer composition according to claim 1 on a substrate film, in which a surface of the substrate has an arithmetical mean roughness of 0.5 μm or less and/or a maximum height of projections thereon of 2 μm or less and 1,000 projections/$m^2$ or less of projections having a height of 0.2 μm to 2 μm, and a surface of the cured product has an arithmetical mean roughness of 0.2 μm or less and/or a maximum height of projections thereon of 2 μm or less and 500 projections/$m^2$ or less of projections having a height of 0.2 μm to 2 μm.

13. A method for producing a cured product, which comprises coating a substrate with the polymer composition according to claim 1, and subjecting the composition to heat curing and/or photo-curing.

* * * * *